(12) United States Patent
Panicacci

(10) Patent No.: US 7,696,545 B2
(45) Date of Patent: Apr. 13, 2010

(54) SKIMMED CHARGE CAPTURE AND CHARGE PACKET REMOVAL FOR INCREASED EFFECTIVE PIXEL PHOTOSENSOR FULL WELL CAPACITY

(75) Inventor: Roger Panicacci, San Clemente, CA (US)

(73) Assignee: Micron Technology, Inc., Boise, ID (US)

( * ) Notice: Subject to any disclaimer, the term of this patent is extended or adjusted under 35 U.S.C. 154(b) by 158 days.

(21) Appl. No.: 11/511,209

(22) Filed: Aug. 29, 2006

(65) Prior Publication Data

US 2008/0074524 A1 Mar. 27, 2008

(51) Int. Cl.
*H01L 31/062* (2006.01)
(52) U.S. Cl. ................. 257/292; 257/291
(58) Field of Classification Search ................. 348/308; 257/221, 291, 292
See application file for complete search history.

(56) References Cited

U.S. PATENT DOCUMENTS

| | | | |
|---|---|---|---|
| 5,146,302 A | 9/1992 | Kumada | |
| 6,088,058 A * | 7/2000 | Mead et al. | 348/296 |
| 6,140,630 A | 10/2000 | Rhodes | |
| 6,147,340 A | 11/2000 | Levy | |
| 6,204,524 B1 | 3/2001 | Rhodes | |
| 6,310,366 B1 | 10/2001 | Rhodes | |
| 6,326,652 B1 | 12/2001 | Rhodes | |
| 6,333,205 B1 | 12/2001 | Rhodes | |
| 6,376,868 B1 | 4/2002 | Rhodes | |
| 6,504,141 B1 | 1/2003 | Kozlowski et al. | |
| 6,570,617 B2 * | 5/2003 | Fossum et al. | 348/308 |
| 6,624,456 B2 * | 9/2003 | Fossum et al. | 257/292 |
| 6,665,012 B1 * | 12/2003 | Yang et al. | 348/308 |
| 6,930,722 B1 | 8/2005 | Nakamura et al. | |
| 6,977,685 B1 | 12/2005 | Acosta-Serafini et al. | |
| 2003/0117386 A1 | 6/2003 | Mabuchi | |
| 2005/0052554 A1 | 3/2005 | Sakurai et al. | |
| 2005/0151866 A1 | 7/2005 | Ando et al. | |
| 2005/0206548 A1 * | 9/2005 | Muramatsu et al. | 341/172 |
| 2008/0074523 A1 * | 3/2008 | Panicacci | 348/308 |

FOREIGN PATENT DOCUMENTS

| | | |
|---|---|---|
| EP | 0 793 378 A | 9/1997 |
| EP | 1 775 934 A | 3/2007 |

OTHER PUBLICATIONS

David X D Yang et al., "A 640 * 512 CMOS Image Sensor with Ultrawide Dynamic Range Floating-Point Pixel-Level ADC," IEEE Journal of Solid-State Circuits, vol. 34, No. 12, Dec. 1999.

* cited by examiner

*Primary Examiner*—Wai-Sing Louie
*Assistant Examiner*—Bilkis Jahan
(74) *Attorney, Agent, or Firm*—Dickstein Shapiro LLP

(57) ABSTRACT

An imaging device having pixels that store charge from a photosensor under at least one storage gate during a sampling period. A driver used to operate the at least one storage gate, estimates how much charge in the pixel exceeds a predetermined limit during a non-destructive pixel sensing operation. A specific voltage is stored on the pixel's floating diffusion region to flag how many times the pixel exceeded the limit. The final pixel signal and the stored information is readout at the end of integration period to create a sum that represents the pixel's final signal value.

26 Claims, 15 Drawing Sheets

SKIMMED CHARGE CAPTURE AND CHARGE PACKET REMOVAL FOR INCREASED EFFECTIVE PIXEL PHOTOSENSOR FULL WELL CAPACITY

FIELD OF THE INVENTION

Embodiments of the invention relate generally to imaging devices and more particularly to a method and apparatus for achieving high dynamic range in an imaging device.

BACKGROUND

A CMOS imager circuit includes a focal plane array of pixel cells, each one of the cells including a photosensor, for example, a photogate, photoconductor or a photodiode overlying a substrate for accumulating photo-generated charge in the underlying portion of the substrate. Each pixel cell has a readout circuit that includes at least an output field effect transistor formed in the substrate and a charge storage region formed on the substrate connected to the gate of an output transistor. The charge storage region may be constructed as a floating diffusion region. Each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the necessary functions of: (1) photon to charge conversion; (2) accumulation of image charge; (3) resetting the storage region to a known state before the transfer of charge to it; (4) transfer of charge to the storage region; (5) selection of a pixel for readout; and (6) output and amplification of a signal representing pixel charge. The charge at the storage region is typically converted to a pixel output voltage by a source follower output transistor.

CMOS imagers of the type discussed above are generally known as discussed, for example, in U.S. Pat. No. 6,140,630, U.S. Pat. No. 6,376,868, U.S. Pat. No. 6,310,366, U.S. Pat. No. 6,326,652, U.S. Pat. No. 6,204,524 and U.S. Pat. No. 6,333,205, assigned to Micron Technology, Inc., which are hereby incorporated by reference in their entirety.

FIG. 1 illustrates a CMOS imager 100 having a pixel array 102 connected to column sample and hold (S/H) circuitry 136. The pixel array 102 comprises a plurality of pixels 110 arranged in a predetermined number of rows and columns. The illustrated pixel 110 contains a pinned photodiode photosensor 112, transfer gate 114, a floating diffusion region FD to collect charge transferred from the photosensor 112, a reset transistor 116, row select transistor 120 and a source follower output transistor 118. The pixel 110 also includes a storage gate 124 for storing charge from the photosensor 112 in a channel region 124b when a storage gate control signal SG is applied to a storage gate control line 124a. FIG. 1 also shows an anti-blooming gate 125, which may be used to drain away excess charge from the photosensor 112 to region 127 when an anti-blooming control signal AB is applied to the anti-blooming gate 125. Without the anti-blooming gate 125, the pixel 110 is a five transistor (5T) pixel. If the anti-blooming gate 125 is used, the pixel 110 is a six transistor (6T) pixel.

The reset transistor 116 is connected between the floating diffusion region FD and an array pixel supply voltage Vaa-pix. A reset control signal RST is used to activate the reset transistor 116, which resets the floating diffusion region FD to the array pixel supply voltage Vaa-pix level as is known in the art. The source follower transistor 118 has its gate connected to the floating diffusion region FD and is connected between the array pixel supply voltage Vaa-pix and the row select transistor 120. The source follower transistor 118 converts the charge stored at the floating diffusion region FD into an electrical output voltage signal Vout. The row select transistor 120 is controllable by a row select signal SEL for selectively connecting the source follower transistor 118 and its output voltage signal Vout to a column line 122 of the pixel array 102.

In operation, the pixels 110 of each row in the array 102 are all turned on at the same time by a row select line e.g., SEL(0) and the pixels 110 of each column are selectively output onto a column line 122. A plurality of row and column lines are provided for the entire array 102. The row lines e.g., SEL(0) are selectively activated by row decoder 130 and driver circuitry 132 in response to an applied row address. Column select lines (not shown) are selectively activated in response to an applied column address by column circuitry that includes column decoder 134. Thus, row and column addresses are provided for each pixel 110. The CMOS imager 100 is operated by a sensor control and image processing circuit 150, which controls the row and column circuitry for selecting the appropriate row and column lines for pixel readout.

Each column is connected to sampling capacitors and switches in the S/H circuitry 136. A pixel reset signal Vrst and a pixel image signal Vsig for selected pixels are sampled and held by the S/H circuitry 136. A differential signal (Vrst−Vsig) is produced for each readout pixel by the differential amplifier 138 (AMP), which applies a gain to the signal received from the S/H circuitry 136. The differential signal is digitized by an analog-to-digital converter 140 (ADC). The analog-to-digital converter 140 supplies the digitized pixel signals to the sensor control and image processing circuit 150, which among other things, forms a digital image output. The imager also contains biasing/voltage reference circuitry 144.

The FIG. 1 imager 100 has a pixel configuration that uses a storage gate 124 and anti-blooming gate 125 to achieve a global shutter operation (as opposed to a rolling shutter). Typically, the TX, RST, SG, and SEL control signals are driven horizontally from the row driver 132 (respectively shown as TX(0), RST(0), SG(0) and SEL(0) to indicate signals for row number 0 in the array 102) while the pixel power (e.g., Vaa-pix) and output Vout are routed vertically to the column circuitry 136.

There is a need and desire for an improved technique for achieving high dynamic range that does not suffer from the aforementioned shortcomings of the conventional techniques.

DETAILED DESCRIPTION

Figure 1:
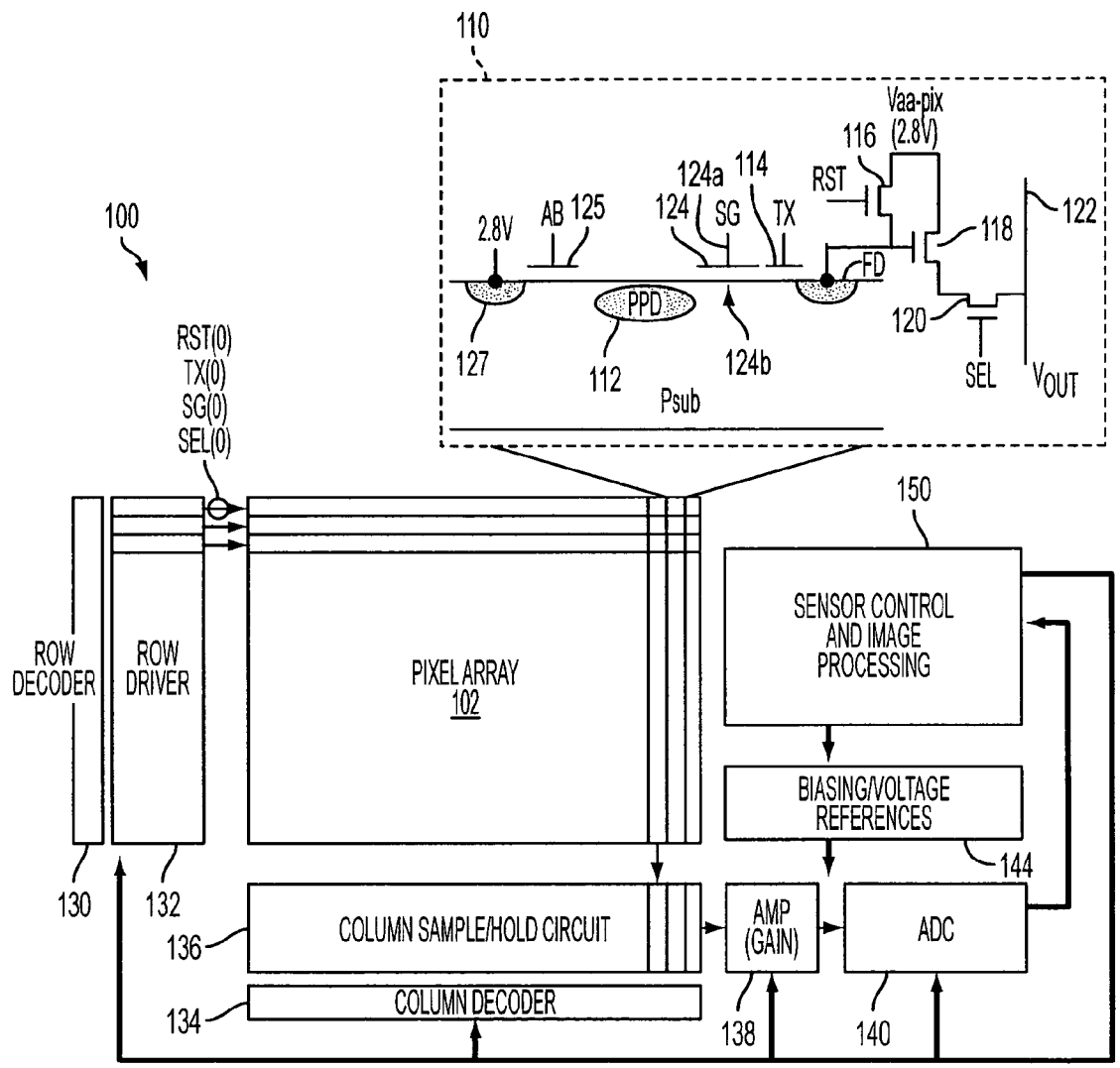
FIG. 1 illustrates a CMOS imager.

In the following detailed description, reference is made to the accompanying drawings, which are a part of the specification, and in which is shown by way of illustration various embodiments of the invention and how they may be practiced. These embodiments are described in sufficient detail to enable those skilled in the art to make and use them. It is to be understood that other embodiments may be utilized, and that structural, logical, and electrical changes, as well as changes in the materials used, may be made.

The term "pixel" refers to a photo-element unit cell containing a photo-conversion device or photosensor and transistors for processing an electrical signal from electromagnetic radiation sensed by the photo-conversion device. The pixels discussed herein are illustrated and described as inventive modifications to six transistor (6T) pixel circuits for the sake of example only. It should be understood that the embodiments of the invention are not limited to a six transistor (6T) pixel, but may be used with other pixel arrangements having fewer (e.g., 3T, 4T, 5T) or more (e.g., 7T) than six transistors. Although the embodiments are described herein with reference to the architecture and fabrication of one pixel, it should be understood that this is representative of a plurality of pixels in an array of an imager device. In addition, although the embodiments are described below with reference to a CMOS imager, they have applicability to any solid state imaging device having pixels. The following detailed description is, therefore, not to be taken in a limiting sense.

Currently, there are many techniques designed to achieve high dynamic range image outputs. These techniques rely on pixels that have variable response to adapt to higher illumination levels (i.e., linear response at lower illumination levels and logarithmic response at higher illumination), or variable bias conditions to remove a percentage of any accumulated charge at higher illumination levels; other techniques use variable exposure times. Pixels that use variable response circuit techniques like logarithmic pixels or that use variable bias conditions to spill off excess charge typically suffer from pixel-to-pixel response variation; this occurs due to the difficulty in achieving high precision transistor device matching.

Proposed methods that use variable exposure time must tradeoff spatial resolution for rows of pixels with different exposure times, which is undesirable. In addition, there are other techniques that add multiple transistors to the pixel circuits. The addition of multiple transistors to the already "fill factor" sensitive pixels is undesirable and does not allow for small-sized pixels. To date, all of the above mechanisms are undesirable.

Embodiments of the invention provide an imager with high dynamic range by capturing charge that exceeds the full well capacity of the imager's pixels. The embodiments also use the floating diffusion region to store an analog value representative of the how many times the charge in a pixel's photosensor exceeded a predetermined limit. The embodiments work for rolling shutter style readout and global shutter readout operations. It is expected that as more applications require high dynamic range images, or as pixel full well capacity shrinks, that the embodiments will enable image capture beyond the response range of a pixel's typical linear response.

By modifying a typical 6T global shutter pixel to include an extra transfer gate between the photosensor and a storage gate as well as modifying how the storage gate is controlled, an estimate of how much charge in the pixel exceeds a predetermined limit is obtained through a non-destructive pixel sensing operation. A specific voltage is stored on the pixel's floating diffusion region to flag how many times the pixel exceeded the limit. The final pixel signal and the stored information is readout at the end of integration period to create a sum that represents the pixel's final signal value.

In one embodiment, individual pixels may be reset within a row of pixels by modifying the 6T pixel to further include an extra anti-blooming gate, which is used during pixel reset and driven by a column circuit. In rolling shutter mode, added column circuits sense the charge and perform the comparison for a particular row. Multiple scans of the array are done during the integration time by performing the sense/compare step on multiple rows as readout occurs for a row during normal pixel readout. Each sense/compare step also involves writing an analog value to the floating diffusion region indicative of the number of times the photosensor charge exceeds the predetermined limit.

In order to achieve a true global shutter operation, where start of integration occurs at the same time for all pixels, a comparator is added to a group of pixels to perform the thresholding operation on the charge stored under the storage gate. This comparator output is used to reset the pixel and to determine the value written into the pixel's floating diffusion region.

Figure 2:
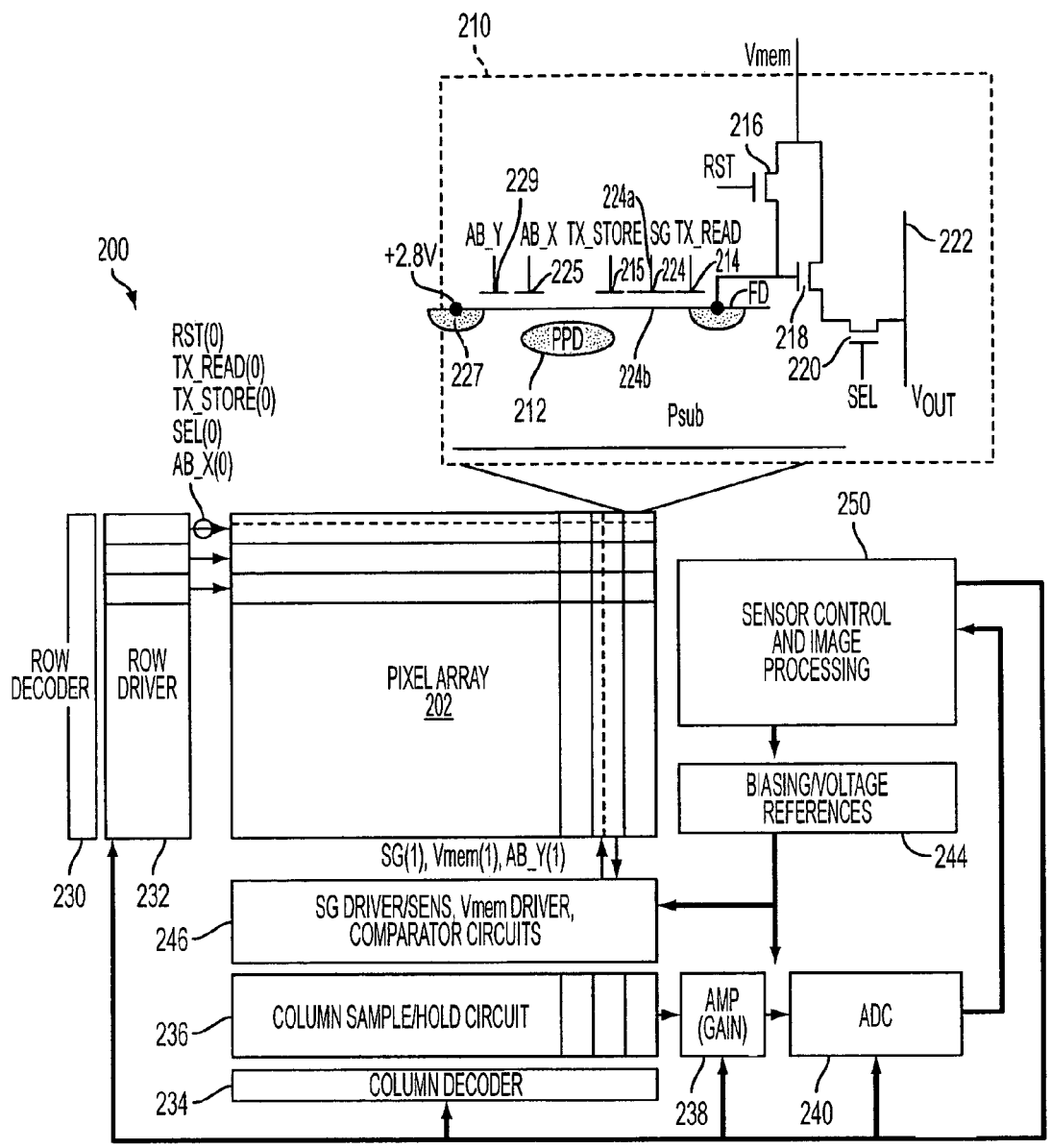
FIG. 2 illustrates a CMOS imager constructed in accordance with an embodiment.

FIG. 2 illustrates a CMOS imager 200 constructed in accordance with an embodiment of the invention. The illustrated imager 200 includes a pixel array 202 comprising a plurality of pixels 210 arranged in a predetermined number of rows and columns. The outputs Vout of each pixel 210 are connected to column output lines 222, which are connected to column circuitry that includes sensing, driver and comparator circuit 246 and column sample and hold (S/H) circuit 236.

The illustrated pixel 210 contains a pinned photodiode photosensor (PPD) 212, read transfer gate 214, storage transfer gate 215, and a floating diffusion region FD to collect charge transferred from the photosensor 212. Each pixel 210 also includes a reset transistor 216, row select transistor 220 and a source follower output transistor 218. The pixel 210 further includes a storage gate 224 for storing charge from the photosensor 212 in a channel region 224b when a storage gate control signal SG is applied to a storage gate control line 224a. Two anti-blooming gates 225, 229 are also included to drain away charge to region 227 when the gates 225, 227 are activated. The first anti-blooming gate 225 is controlled by a first AB control signal AB_X and the second anti-blooming gate 229 is controlled by a second AB control signal AB_Y.

The reset transistor 216 is connected between the floating diffusion region FD and a memory voltage Vmem (described in more detail below) received from the sensing, driver and comparator circuit 246. A reset control signal RST is used to activate the reset transistor 216, which places the memory voltage Vmem on the floating diffusion region FD. The source follower transistor 218 has its gate connected to the floating diffusion region FD and is connected between the memory voltage Vmem and the row select transistor 220. The source follower transistor 218 converts the charge stored at the floating diffusion region FD into the electrical output voltage signal Vout. The row select transistor 220 is controllable by a row select signal SEL for selectively connecting the source follower transistor 218 and its output voltage signal Vout to the column line 222.

Row lines e.g., SEL(0) connected to the array 202 are selectively activated by row decoder 230 and row driver circuitry 232 in response to an applied row address. Column select lines are selectively activated in response to an applied column address by column circuitry including a column decoder 234. It should be noted that in the figures, RST(0), TX_read(0), TX_store(0), SEL(0), AB_X(0) indicate RST, TX_read, TX_store, SEL and AB_X signals for a particular row (e.g., row 0). Likewise, SG(1), Vmem(1) and AB_Y(0) are used to indicate SG, Vmem and AB_Y signals for a particular column (e.g., column 1).

The CMOS imager 200 is operated by a sensor control and image processing circuit 250, which controls the row and column circuitry for selecting the appropriate row and column lines for pixel readout. Each column is connected to sampling capacitors and switches in S/H circuitry 236. A pixel reset signal Vrst and a pixel image signal Vsig for selected pixels are sampled and held by the S/H circuitry 236. A differential signal (Vrst−Vsig) is produced for each pixel by the differential amplifier 238 (AMP), which applies a gain to the signal received from the S/H circuitry 236. The differential signal is digitized by an analog-to-digital converter 240 (ADC). The analog-to-digital converter 240 supplies the digitized pixel signals to the sensor control and image processing circuit 250, which among other things, forms a digital image output. The imager 200 also contains biasing/voltage reference circuitry 244.

Imager 200 is different than the FIG. 1 imager 100 in the following ways. In the illustrated embodiment, an additional transfer gate (i.e., storage transfer gate 215) is added to each pixel 210 in the array 202. The extra transfer gate 215 enables a charge transfer from the photosensor 212 to the storage gate 224 in response to a TX_store control signal. The other transfer gate 214 enables a charge transfer from the storage gate 224 to the floating diffusion region FD in response to a TX_read control signal. Another difference is that the storage gate 224 is routed in the vertical direction to the column circuits (e.g., circuit 246, 236). The sensing, driver and comparator circuit 246 contains a driver to control the storage gate 224 and also has a mode to sense a change in stored charge under the storage gate 224. The transfer gate control signals TX_store, TX_read, however, are routed in the horizontal direction. In addition, each pixel 210 includes an extra antiblooming gate 229, which is controlled by the second AB control signal AB_Y that is routed in the vertical direction. The first AB control signal AB_X is routed in the horizontal direction.

In operation, a row of pixels is sampled after a predetermined sampling exposure time has elapsed. The sampling operation is used to determine whether the amount of accumulated charge has exceeded a predetermined level in each pixel 210. This sampling process is non-destructive and may typically occur in between normal row readout operations, where the final pixel signal is readout at the end of an exposure period. As an example, four sense and compare checks of each pixel 210 may be done to boost the effective full well capacity of the pixel 210 four times.

Figure 3:
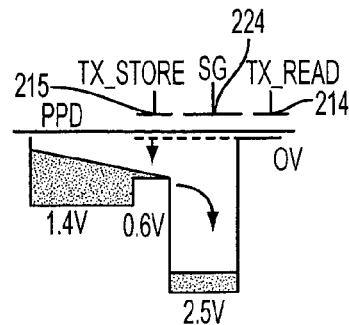
FIG. 3 illustrates a potential diagram for an operation of the FIG. 2 imager.

To perform the non-destructive read, the storage gate 224 is activated (via the SG control signal) by the sensing, driver and comparator circuit 246 that is shared by all pixels 210 in that column. After the storage gate 224 is activated, but before charge is transferred under it, a charge sensing circuit (described below in more detail) within the sensing, driver and comparator circuit 246 is enabled. Then, the TX_store control signal is set to a predetermined high level that allows only charge that exceeds that level to transfer from the photosensor (PPD) to the channel underneath the storage gate 224 (see FIG. 3). This will be referred to herein as "skimming" (or a "skim" operation). The charge sensing circuit within the column sensing, driver and comparator circuit 246 senses the transferred charge and generates outputs proportional to the transferred charge.

A comparator circuit (within sensing, driver and comparator circuit 246) attached to the output of the SG sense circuit (also within sensing, driver and comparator circuit 246) is used to determine roughly how much charge was "skimmed" off the photosensor 212. A threshold reference voltage (input by the comparator circuit) is used to estimate whether the transferred charge exceeds the predetermined limit (i.e., threshold) and whether the charge in the photosensor 212 should be cleared out (hereinafter referred to as a "spill" operation). After the "spill" operation is complete, the storage gate 224 is deactivated and charge under the storage gate 224 is transferred back to the photosensor 212 to continue charge integration. The floating diffusion region is flagged with a voltage (i.e., memory voltage Vmem) to indicate how many spill operations occurred for the particular pixel 210. The voltage Vmem is written to the floating diffusion region FD through the reset transistor 216, when a high level RST control signal is applied to the gate of the reset transistor 216, to flag the number of times the fixed amount of charge was removed. During normal pixel readout operations, the voltage memory Vmem is set to a reset level (e.g., 2.8V) instead of the value determined by the skim and spill operations.

As stated previously, each pixel 210 may be sampled this way multiple times during a single integration period. Multiple transfers occur during a frame to determine when the charge level exceeds a predefined threshold (set by the TX_store voltage level) to avoid saturation of the pixel 210. If the charge exceeds the threshold, a fixed amount of charge is removed from the photosensor 212 and the excess charge under the storage gate 224 is pushed by back to the photosensor. As is described below in more detail, the SG control signal is also set high (to activate the storage gate 224) during pixel readout to transfer charge to the floating diffusion region FD and during photosensor reset at the start of integration.

It should be appreciated that the two AB control signals AB_Y and AB_X can be generated to allow individual pixels 210 to be reset through the anti-blooming gates 229, 225. As can be seen in FIG. 2, in the illustrated embodiment, the storage gate control signals SG are routed vertically to column circuits, which allows the sensing, driver and comparator circuit 246 to sense charge under the gate 224. In this embodiment, the pixels 210 are readout and operated using a rolling shutter operation; the storage gates 224 are not used to store charge for global shutter operation. If the amount of charge transferred under the storage gate 224 is large enough, the photosensor 212 is reset by the sensing, driver and comparator circuit 246 by setting the second AB control signal AB_Y high (with the first AB control signal AB_X already high for that row). If the amount of charge does not exceed the predetermined threshold, the second AB control signal AB_Y is left at a low voltage to keep anti-blooming gate 229 off.

Figure 4A:
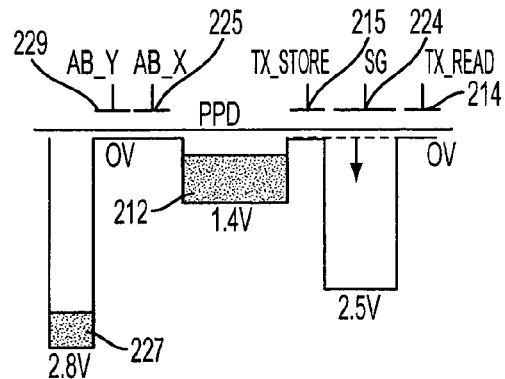
FIGS. 4a-4k illustrate potential diagrams associated with an example operation of the FIG. 2 imager for detecting excess charge and subsequent possible photosensor reset.
Figure 4B:
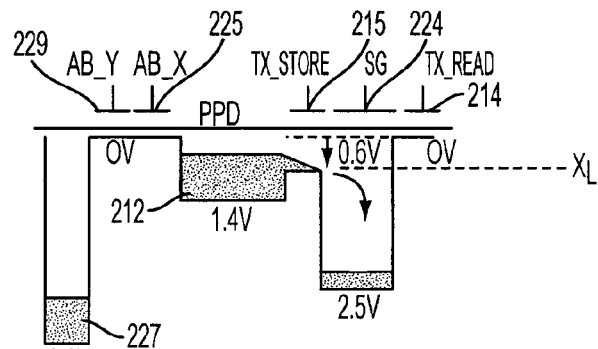

FIGS. 4a-4k illustrate potential diagrams associated with an example operation of the FIG. 2 imager 200 for detecting excess charge and subsequent possible photosensor reset operations. FIG. 4a illustrates charge captured by the photosensor 212 during an interval of the integration period. During this time, the storage gate 224 is pre-charged to a high level (e.g., 2.5V). FIG. 4b illustrates the "skim" operation. During the skim operation, the TX_store control signal is generated to activate the storage transfer gate 215, which creates a predetermined channel potential of e.g., 0.6V, as indicated by the label $X_L$. Charge that exceeds this predetermined level $X_L$ spills over the channel to the region underneath the storage gate 224. This spilled over charge is sensed by the sensing, driver and comparator circuit 246 (described in more detail below).

Figure 4C:
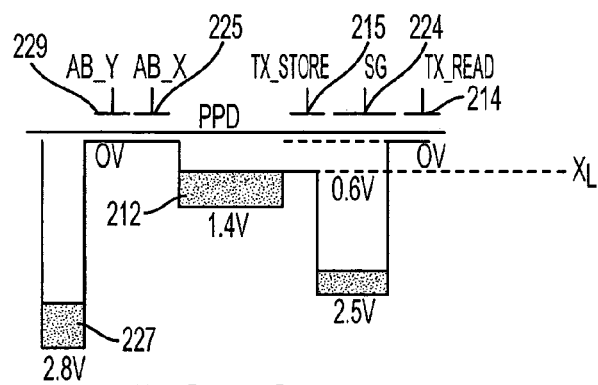
Figure 4D:
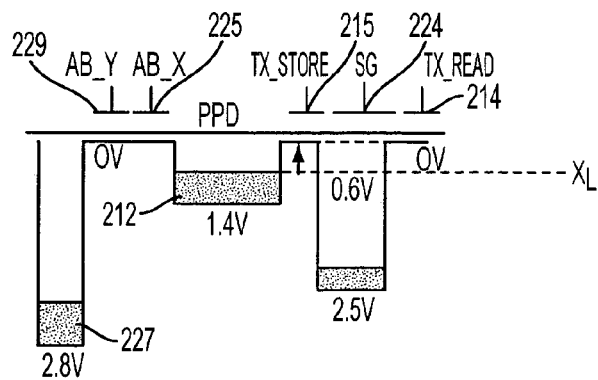
Figure 4E:
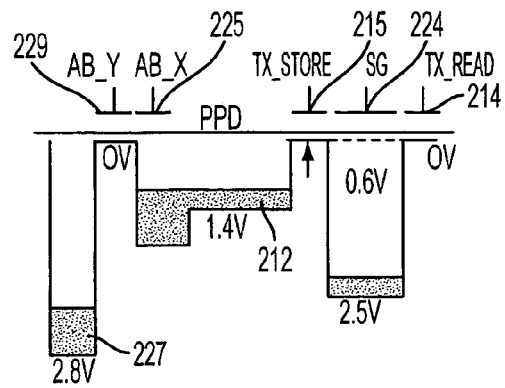
Figure 4F:
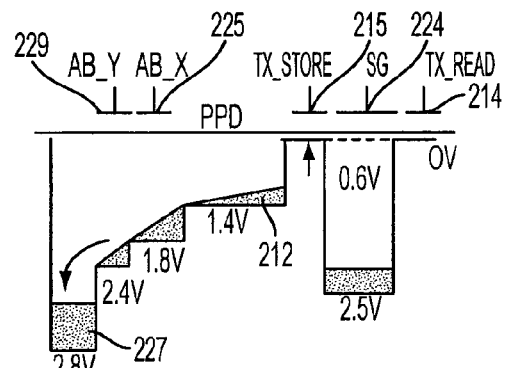
Figure 4G:
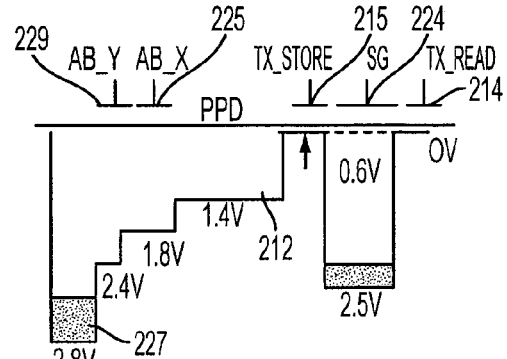

FIG. 4c, illustrates the completion of the charge transfer. The photodiode photosensor 212 is now only filled with charge from its storage potential level (e.g., 1.4V) to 0.6V (i.e., the predetermined level $X_L$ of the storage transfer gate 215). In FIG. 4d, the transfer gate 215 is deactivated. In FIG. 4e, anti-blooming gate 225 for the row being sensed is activated by the first AB control signal AB_X causing charge from the photosensor 212 to move under the gate 225. FIG. 4f illustrates the "spill" operation whereby all of the remaining photosensor 212 charge spills over into region 227. Prior to the spill operation, a comparison of the sensed storage gate 224 voltage and the predetermined voltage reference (that sets the threshold for clearing out the photosensor charge) is performed. If the comparison circuit within the sensing, driver and comparator circuit 246 senses that charge exceeded the predetermined threshold, the comparator circuit drives the second AB control signal AB_Y to activate anti-blooming gate 229 to transfer the charge from the photosensor 212 to region 227 (shown as a 2.8V supply voltage). FIG. 4g shows a completed photosensor reset operation.

Figure 4H:
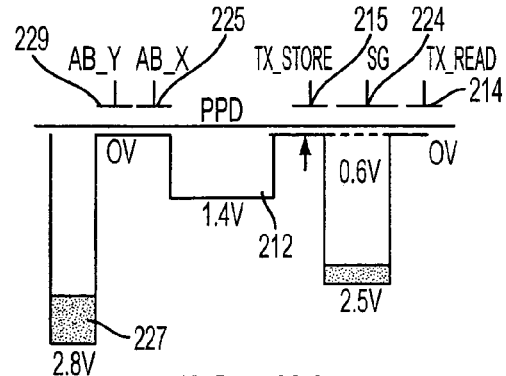
Figure 4I:
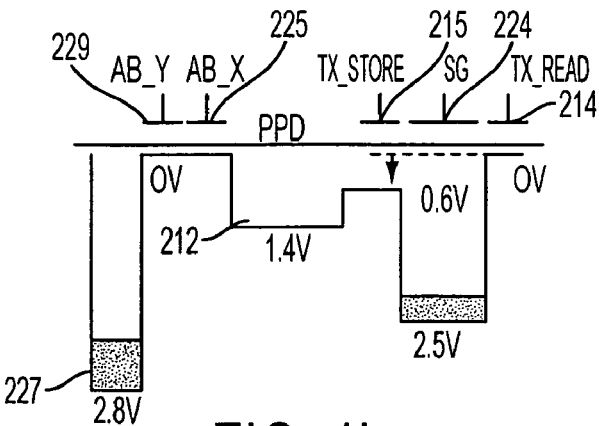
Figure 4J:
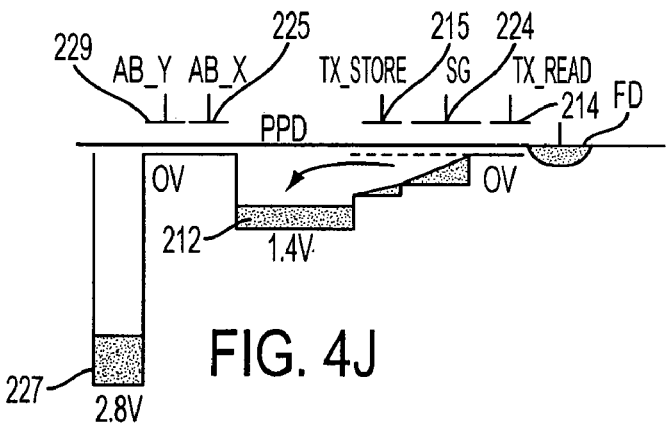

In FIG. 4h, the two AB control signals AB_X, AB_Y are deactivated to deactivate the anti-blooming gates 225, 229. The comparator output (within the sensing, driver and comparator circuit 246) is forced low by changing the comparator's reference voltage. Next, the storage transfer gate 215 is activated (FIG. 4i). Excess charge from the storage gate 224 is transferred back to the photosensor 212 (via the activated storage transfer gate 215 and the deactivated storage gate 224) (FIG. 4j). The comparator output (within the sensing, driver and comparator circuit 246) is checked and the floating diffusion region's FD voltage is readout.

Figure 4K:
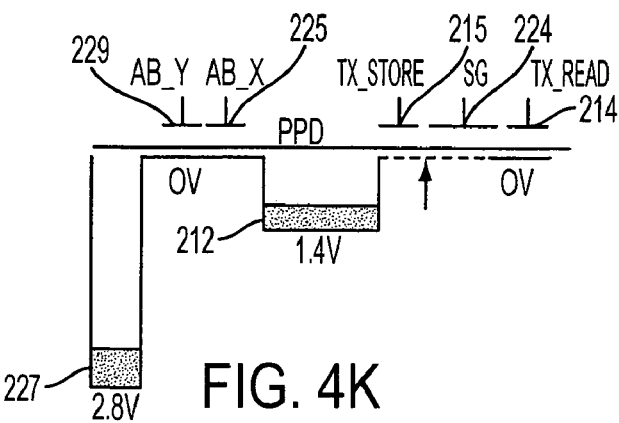

If the comparator sensed excess charge and a subsequent spill operation was performed, the floating diffusion region FD voltage is set to a value indicative of the number of spill operations (via Vmem). Because multiple checks are done during the frame, the floating diffusion region FD voltage is set to a predetermined value (via Vmem) to indicate the number of spill operations that occurred. In an embodiment, Vmem can have the following values: (1) for zero spill operations: 2.5V (initialized here at start of integration); for one spill operation: 2.2V; (3) for two spill operations: 1.9V; and (4) for three spill operations: 1.6V. It should be appreciated that these values for Vmem are merely examples. As such, the embodiments are not to be limited to the specific values discussed herein. FIG. 4k illustrates that charge integration continues with excess charge contained in the photosensor 212 from the prior skim/threshold comparison operation.

FIGS. 5a-5f illustrate potential diagrams associated with an example operation of the FIG. 2 imager 200 for filling a pixel 210 with charge and measuring the charge associated with a reset limit for the pixel 210. The measured charge is readout after the pixel 210 is readout; the digitized measured charge value is multiplied by the number of times the pixel was reset (i.e., by the skim and spill operations shown in FIGS. 4a-4k) as indicated by the voltage stored in the pixel's floating diffusion region FD. That value is added to the digitized pixel signal value obtained by the normal pixel readout method to determine the proper pixel signal output for the pixel 210.

Figure 5A:
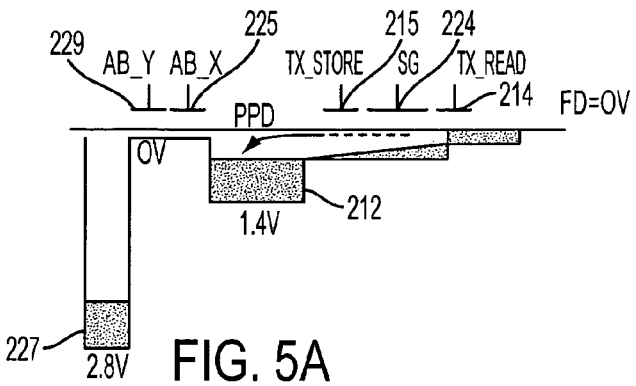
FIGS. 5a-5f illustrate potential diagrams associated with an example operation of the FIG. 2 imager for filling a pixel with charge and measuring the charge associated with a reset limit.

Because of threshold voltage (Vt) variations of the storage transfer gate 215 and the photosensor 212 (e.g., if a pinned photodiode is used as the photosensor 212, there may be pinned voltage variations), it is necessary to measure the charge capacity of the spill operation during the readout. First, as shown in FIG. 5a, the photosensor 212 is filled with charge by activating the two transfer gates 214, 215 and the storage gate 224. The voltage at the floating diffusion region FD is set low (e.g., 0V) by activating the reset transistor 216 (FIG. 2) and setting Vmem to the low voltage (e.g., 0V).

Figure 5B:
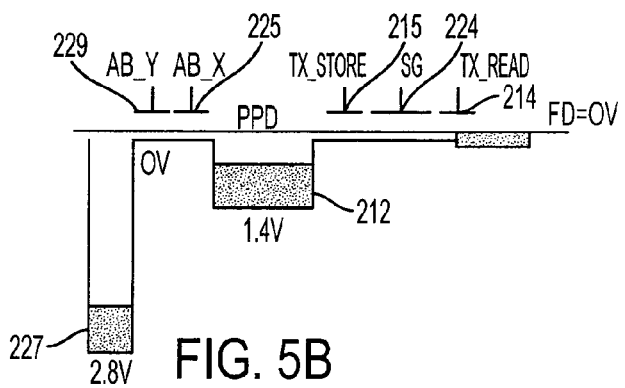
Figure 5C:
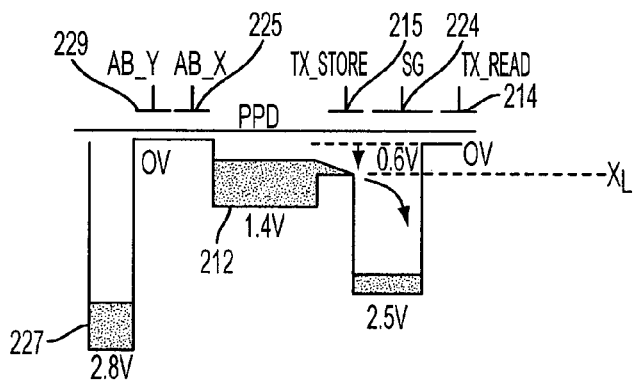
Figure 5D:
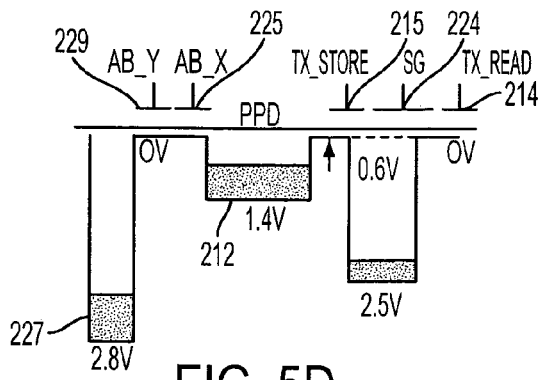
Figure 5E:
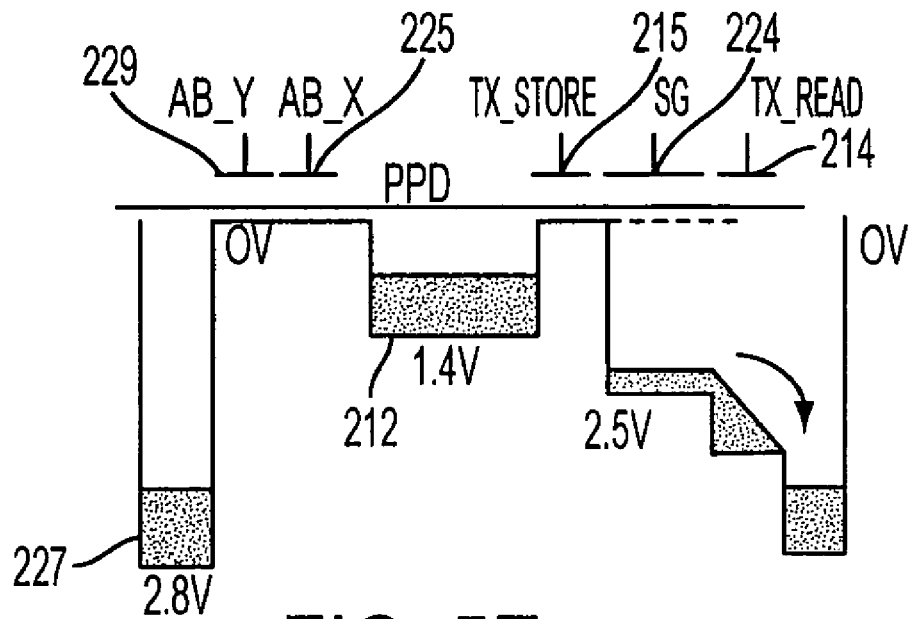
Figure 5F:
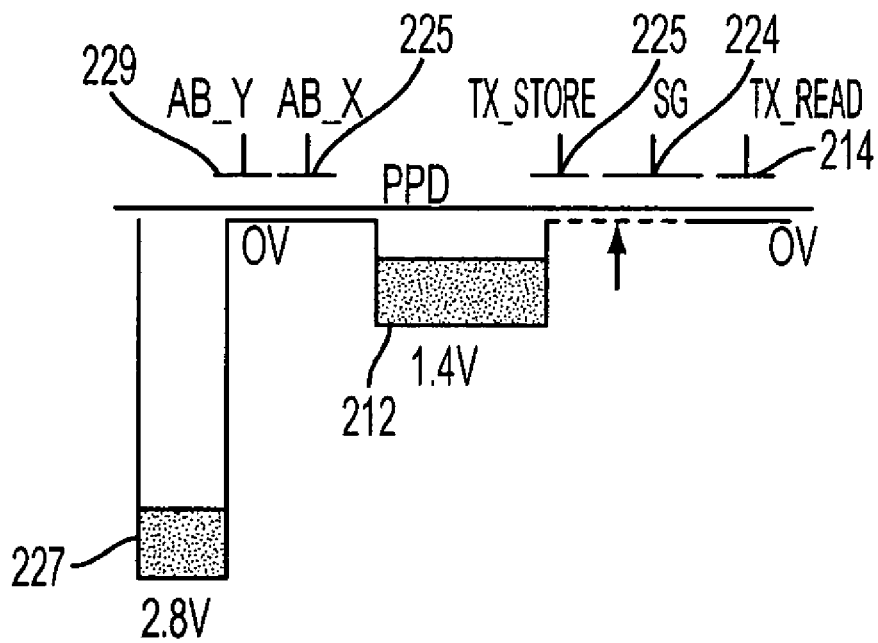

After the fill operation is complete, the two transfer gates 214, 215 and the storage gate 224 are deactivated (FIG. 5b). Charge is spilled off (FIG. 5c) to reduce the charge in the photosensor 212 to the same level $X_L$ (e.g., 0.6V) used during the thresholding operation (described above with reference to FIG. 4b). After this charge transfer is complete, the storage transfer gate 215 is turned off (via TX_store), as is shown in FIG. 5d. As shown in FIG. 5e, excess charge is removed by activating the read transfer gate 214. At this point (FIG. 5f), the photosensor 212 contains the same fixed charge that is normally removed after the skim/threshold operation. This charge is readout from the pixel 210 using the normal readout process after the variable charge is readout.

It is noted that the writing of the analog voltage (Vmem) to the pixel floating diffusion region FD is performed in a manner similar to the manner described in U.S. patent application Ser. No. 11/511,208, now U.S. Pat. No. 7,514,716, entitled "In-Pixel Analog Memory With Non-Destructive Read Sense Circuit For High Dynamic Range Global Shutter Pixel Operation," the disclosure of which is hereby incorporated by reference in its entirety.

Figure 6:
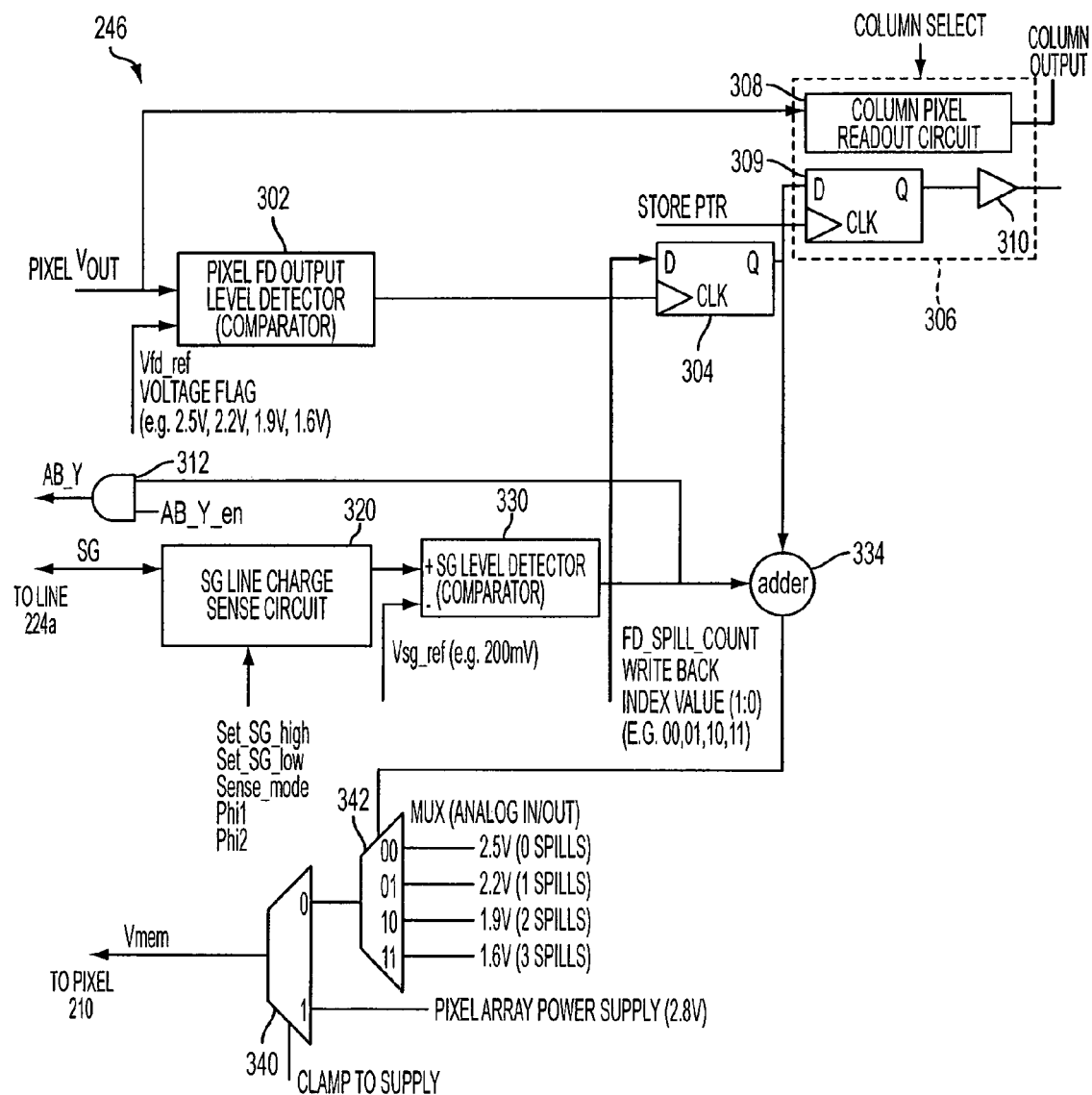
FIG. 6 illustrates one example of a column circuit.

FIG. 6 illustrates one example of a sensing, driver and comparator circuit 246 used in the FIG. 2 imager 200. The circuit 246 includes a pixel FD output level detector 302, which may be implemented as a comparator, a first latch 304, column output circuit 306, an AND gate 312, SG line charging and sensing circuit 320, SG level detector 330, which may also be implemented as a comparator, an adder 334, and two multiplexers 340, 342. In the illustrated embodiment, the column output circuit 306 includes a pixel readout circuit 308, a second latch 309 and a driver 310.

A brief explanation of the circuit 246 is now provided. The output Vout of a pixel is input into the pixel FD output level detector 302 and the column output circuit 306. The pixel FD output level detector 302 also inputs a reference voltage Vfd_ref, and voltage flag values (e.g., 2.5V, 2.0V, 1.9V, 1.6V). The flag values could also be stored in logic, registers, etc. within or attached to the detector 302. The pixel FD output level detector 302 determines the value of the floating diffusion voltage flag (i.e., Vmem) based on the pixel output Vout voltage level.

The flag is used for two purposes: (1) during normal pixel readout the flag is used along with the analog pixel signal to enable other circuits to process the pixel data; and (2) the flag is used during the non-destructive pixel sample operation to determine the value to be written back to the floating diffusion region FD (it can be the same value if the comparator did not detect charge exceeding the threshold limit or an updated value to indicate that the limit was exceeded). The output of circuit 302 is used to clock latch 304. A digital index value FD_spill_amount is stepped along with the comparator threshold reference Vfd_ref value to latch (via latch 304) the associated index value when the floating diffusion voltage value is detected is detected by circuit 302. The digital index value FD_spill_amount is a 2-bit write back pointer having possible binary values of "00", "01", "10" and "11".

The output of the first latch 304 is used as an input into latch 309 within column circuit 306. A store pointer Store_ptr is used to clock latch 309 so that the latch 309 latches and outputs the 2-bit value of the FD_spill_amount. Driver 310 is used to drive the FD_spill_amount out of the column output circuit 306. The readout circuit 308 within the column output circuit 306 outputs the analog pixel signal to the column S/H circuitry 336 (FIG. 2). The output from the driver 310 is a 2-bit digital output. After amplification and analog-to-digital conversion of the analog pixel signal value, the digital value is then summed with the value associated with the number of times excess charge was spilled from the pixel 210 (as indicated by the 2-bit value).

The SG line charging and sensing circuit 320 is connected to the SG line 224a connected to the storage gate 224 (FIG. 2) of the pixel 210. The SG line charging and sensing circuit 320 inputs Set_SG_high, Set_SG_low, and Sense_mode signals and complementary clock signals Phi1, Phi2. The SG line charging and sensing circuit 320 contains switches to activate or deactivate the storage gate 224 (FIG. 2) as well as a switched capacitor circuit to sense the charge transferred under the storage gate 224 (shown and described in greater detail below with respect to FIGS. 13 and 14). The circuit 320 generates a voltage in proportion to the signal sensed. This voltage is passed to SG level detector 330, which also inputs an SG level threshold Vsg_ref (e.g., 200 mV). The output of the detector 330 is sent to the adder 334 and the AND gate 312. The AND gate 312 also inputs an enable AB_Y control signal AB_Y_en, which when set to a high level at the same time the output of detector 330 is high, is used to activate anti-blooming gate 229 (as described above). At the end of the comparison phase, the SG signal is driven low by circuit 320 (in response to the Set_SG_low signal) to push charge back into the photosensor (i.e., by deactivating the storage gate 224).

The output of the first latch 304 is also sent to the adder 334. The output from the adder 334 corresponds to the number of spill operations and is used to control multiplexer 342. If the output from the adder is "00", then the output from multiplexer 342 is a voltage corresponding to zero spill operations (e.g., 2.5V). If the output from the adder is "01", then the output from multiplexer 342 is a voltage corresponding to one spill operation (e.g., 2.2V). If the output from the adder is "10", then the output from multiplexer 342 is a voltage corresponding to two spill operations (e.g., 1.9V). If the output from the adder is "11", then the output from multiplexer 342 is a voltage corresponding to three spill operations (e.g., 1.6V).

The output of the first multiplexer 342 is used as an input to the second multiplexer 340. The second multiplexer 340 also inputs the pixel array power supply voltage (e.g., 2.8V). Based on a clamp signal, a memory voltage Vmem indicative of the pixel's number of spill operations is written to the floating diffusion region FD in the pixel through the reset transistor (as described above). Otherwise, the pixel array power supply voltage (e.g., 2.8V) is output (e.g., for reset and other normal operational modes, described above).

Figure 7:
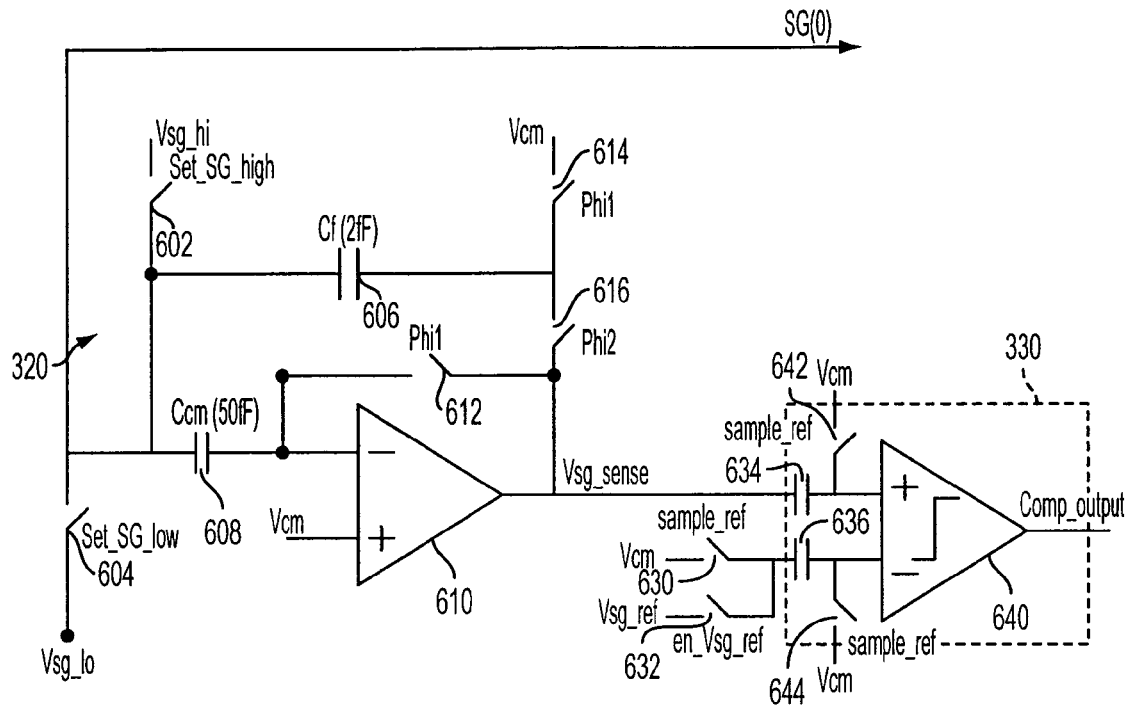
FIG. 7 illustrates storage gate line charge sensing and comparator circuitry.
Figure 8:
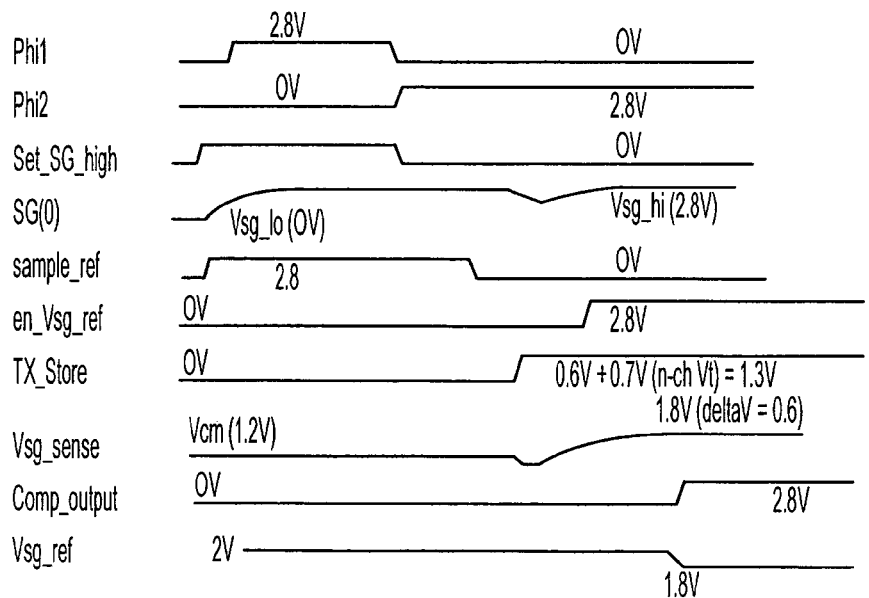
FIG. 8 illustrates a timing diagram for an operation of the FIG. 7 circuitry.

FIG. 7 illustrates storage gate line charge sensing and comparator circuitry used in the FIG. 2 imager 200. FIG. 8 illustrates a timing diagram for an operation of the FIG. 7 circuitry. The circuitry includes the components for the SG line charging and sensing circuit 320 and the SG level detector 330. As discussed above, the SG line charging and sensing circuit 320 drives the SG control signal e.g., SG(0) onto the storage gate control line 224a and can also sense the amount of charge driven out on the line 224a (FIG. 2).

The SG line charging and sensing circuit 320 includes switches 602, 604, 612, 614, 616, an input capacitor 608, a feedback capacitor 606, and an amplifier 610. The feedback capacitor 606 when switched across the amplifier 610 determines the gain of circuit 320. The input capacitor 608 at the inverting input of the amplifier 610 decouples DC voltage levels driven out to the storage gate control line 224a and any DC input voltage to ensure that the amplifier 610 works properly. Switch 602 is controlled by the Set_SG_high control signal. Switch 604 is controlled by the Set_SG_low control signal. Switches 612, 614 are controlled by a first clock signal Phi1. Switch 616 is controlled by a second clock signal Phi2. The two signals Phi1, Phi2 may be non-overlapping complementary clock signals.

The amplifier 610 output Vsg_sense is input into the SG level detector 330. The SG level detector 330 includes switches 630, 632, 642, 644, capacitors 634, 636 and a comparator 640. Switch 632 is controlled by an enable Vsg reference control signal en_Vsg_ref. When the enable Vsg reference control signal en_Vsg_ref causes switch 632 to close, the SG reference voltage Vsg_ref is connected to capacitor 636. Switch 630 is controlled by a sample reference control signal sample_ref. When the sample reference control signal sample_ref causes switch 630 to close, a common mode voltage Vcm is connected to capacitor 636. The sample reference control signal sample_ref also causes switches 642, 644 to close, which connects the common mode voltage Vcm to a second plate of capacitors 634, 636.

The SG signal SG(0) can be set high or low (without using the amplifier 610) during pixel read or shutter operations. In the timing diagram, the SG signal is set high while amplifier offset is stored on capacitor 608 and the feedback capacitor 606 is reset when the first clock signal Phi1 is high. When the second clock signal Phi2 is applied and the feedback circuit is activated, the offset is stored at the input of the comparator 640. Afterwards, the TX_store control signal is activated; at this point, any charge transferred under the storage gate 224 will pull down on the SG line 224a. The feedback circuit will restore the SG line 224a back up to the high voltage value (Vsg_hi) and the Vsg_sense signal will increase in value depending the amount of sensed charge in accordance with the following relationship: V=(Qpixel/Cf)×[ACf/(1+AxCf/Csg_total_column)]×(1/Csg_total_column), where Qpixel=charge under the storage gate 224, A=amplifier open loop gain, and Csg_total_column is the capacitance of the SG line 224a for the column. It should be appreciated that FIG. 8 illustrates sample voltage levels for the illustrated signals and that the various embodiments discussed herein are not limited to these sample levels in any way.

Figure 9:
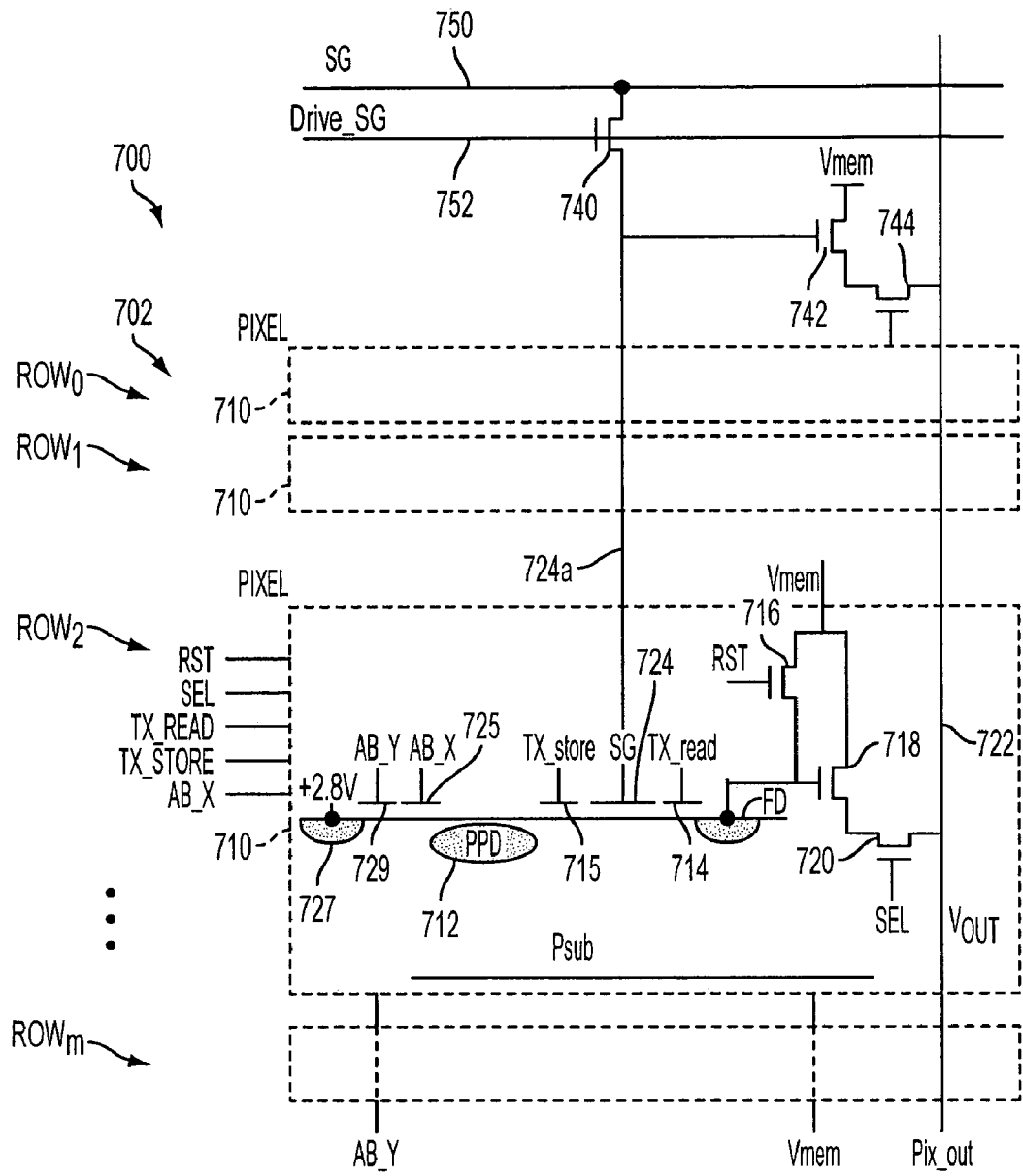
FIG. 9 illustrates an imager having a modified pixel circuit constructed in accordance with an embodiment of the invention.

FIG. 9 illustrates a portion of an imager 700 comprising a pixel array 702 having a modified pixel circuit 710 used to reduce the impact of large parasitic capacitance on the SG line 724a. The capacitance typically impacts the sensitivity of the skim/threshold detection operation step. A plurality of rows $ROW_0, ROW_1, ROW_2, \ldots, ROW_m$ of pixel circuits 710 is illustrated. The pixel circuits 710 include a photosensor 712, storage transfer gate 715, storage gate 724, read transfer gate 714, a floating diffusion region FD, reset transistor 716, source follower transistor 718, and a row select transistor 720 connected to a column output line 722. Two anti-blooming gates 725, 729 are also included to drain charge from the photosensor 712 to region 727. Additional shared circuitry includes a driving transistor 740, an SG source follower transistor 742 and a shared select transistor 744, which can be connected to the row select lines of the shared pixels 1010 or to a global select line (not shown).

Pixels 710 in a column share their SG lines 724a with other pixels 710 in the column. The shared SG lines 724a are buffered with the SG source follower transistor 742. A global SG line 750 is connected to the shared SG line 724a via a drive SG line 752 and transistor 740 (when activated by the Drive_SG control signal). After the storage gates 724 are driven high for the set of shared pixels 710, the SG line 724a is left floating. The TX_store control signal for the row of interest is activated and charge is sensed under the storage gate 724 only for that row. By pre-charging the storage gate 724 to a high enough voltage, the source follower transistor 742 will dominate driving the output line 722. The resulting signal Vout (also shown as Pix_out) on the output line 722 is driven into the comparison circuitry in the column. It should be noted that a separate sense amplifier is not required in the column for this operation. After the sense operation, the storage gate 724 is driven low (i.e., turned off) to put charge back into the photosensor 712 and under the storage transfer gate 715. Then, the storage transfer gate 715 is driven low (in response to the TX_store control signal) to drive the remaining charge into the photosensor 712.

To perform the individual reset operation for a pixel 710 and to perform the final pixel readout, the TX_read control signal is driven to a high value and is routed vertically from a column driver. Thus, with this approach the TX_store, SG, and Drive_SG control signals are driven from the row driver (not shown) and the TX_read control signal is driven by the column driver (not shown). In the illustrated embodiment, three extra transistors 740, 742, 744 are used and three rows were chosen to share the SG line 724a. As such, there is in only one extra transistor per pixel 710.

Figure 10:
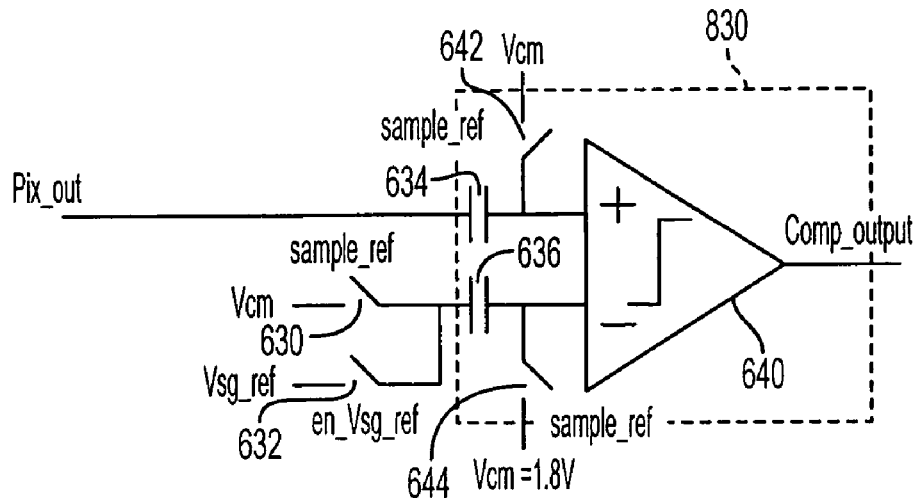
FIG. 10 illustrates a circuit for a buffered storage gate driver with column comparator constructed in accordance with an embodiment of the invention.
Figure 11:
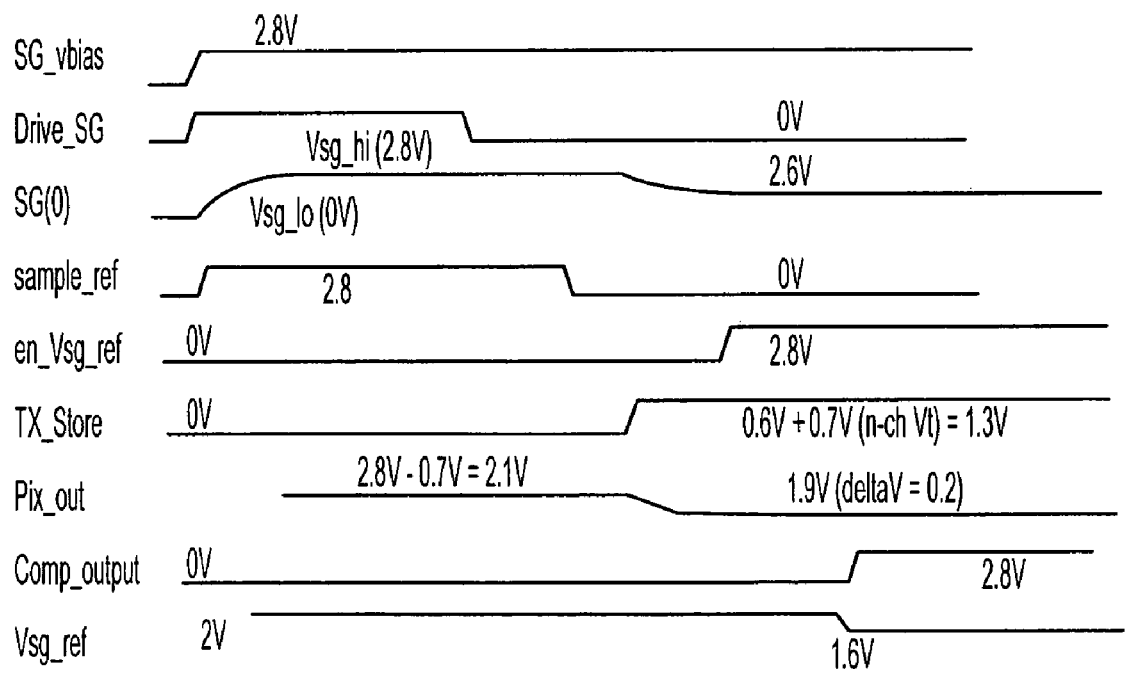
FIG. 11 illustrates a timing diagram for an example operation of the FIGS. 9 and 10 circuitry.

FIG. 10 illustrates a modified SG line sense and compare circuit 830 used with the buffered/shared SG line approach illustrated in FIG. 9. FIG. 11 is a sample timing diagram for the embodiments shown in FIGS. 9 and 10. Circuit 830 comprises switches 630, 632, 642, 644, capacitors 634, 636 and a comparator 640. Switch 632 is controlled by an enable Vsg reference control signal en_Vsg_ref. When the enable Vsg reference control signal en_Vsg_ref causes switch 632 to close, the SG reference voltage Vsg_ref is connected to capacitor 636. Switch 630 is controlled by a sample reference control signal sample_ref. When the sample reference control signal sample_ref causes switch 630 to close, a common mode voltage Vcm is connected to capacitor 636. The sample reference control signal sample_ref also causes switches 642, 644 to close, which connects the common mode voltage Vcm to a second plate of capacitors 634, 636.

The construction of circuit 830 is substantially the same as circuit 330 (FIG. 7). One difference is that circuit 830 is not connected to a sense circuit (e.g., circuit 320 of FIG. 7). Instead, circuit 830 samples and holds the pixel output signal Pix_out (i.e., Vout) in capacitor 634. The timing of circuit 830 is similar to the timing shown in FIG. 8, except that the Drive_SG signal is used to set the SG(0) signal high after a bias SG_vbias is applied to the global SG line 750 (FIG. 9) and the pixel output (Pix_out) is compared in the comparator 640 (instead of Vsg_sense shown in FIG. 7). It should be appreciated that FIG. 11 illustrates sample voltage levels for the illustrated signals and that the various embodiments discussed herein are not limited to these sample levels in any way.

Figure 12:
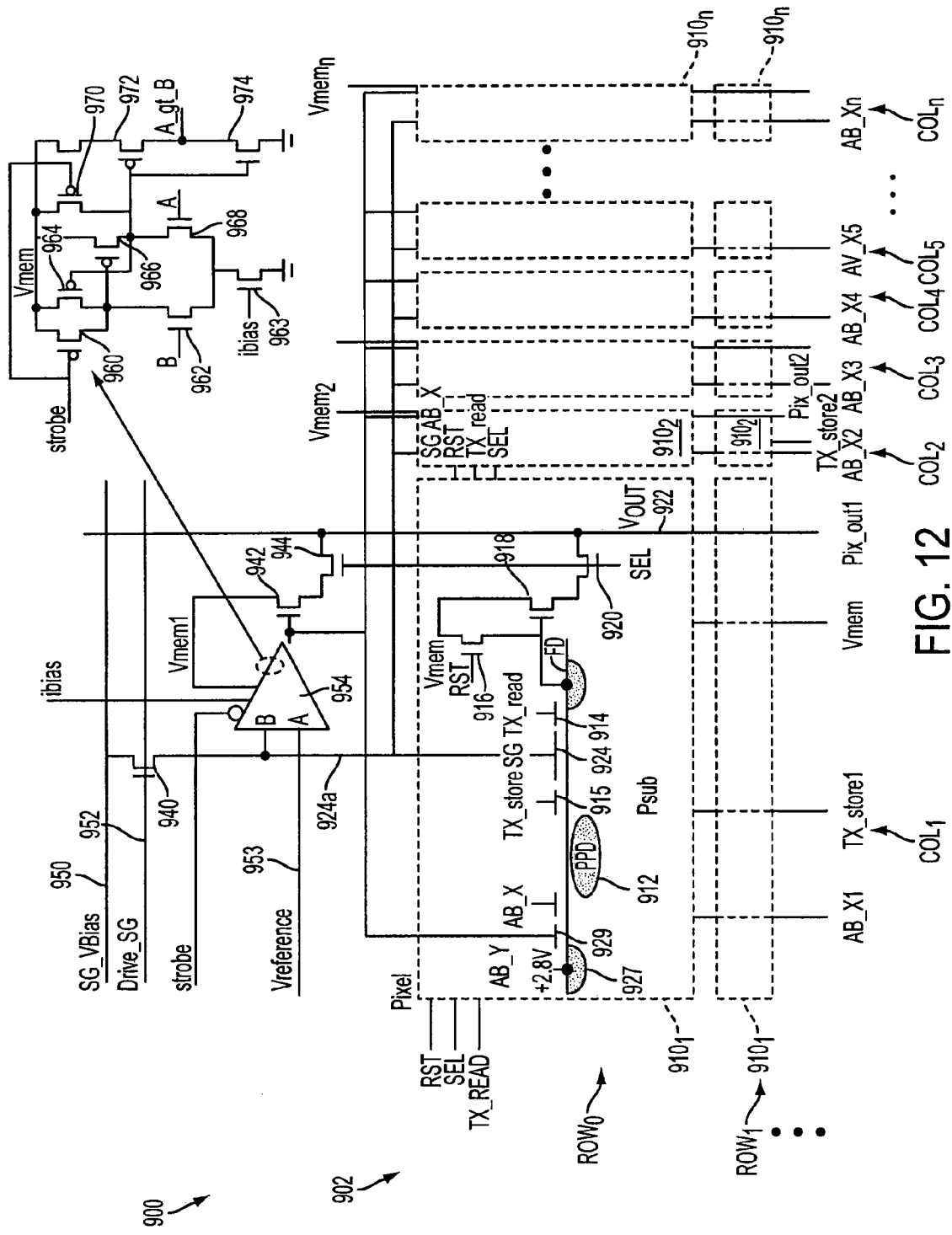
FIG. 12 illustrates an embodiment of an imager in which column comparator circuitry is shared by N pixels in a row.

For global shutter operation where all pixels start integration at the same time, it is desirable to perform detection of the pixel photosensor charge level at approximately the same time. With the rolling detection method with the comparator circuit in the column periphery only a few rows of pixels are checked as readout of the array occurs. To avoid pixels overflowing due to being checked for excess charge too late during the integration time, an array of comparators are embedded in the array as shown in an example embodiment illustrated in FIG. 12. FIG. 12 illustrates an embodiment of an imager 900 in which column comparator circuitry is shared by N pixels $910_1, \ldots, 910_n$ in a row. In this embodiment, the comparison operation is performed simultaneously for all rows $ROW_0$, $ROW_1$, etc. in the array 902. The outputs Vout of each pixel $910_1, \ldots, 910_n$ are connected to column output lines 922, which are connected to column circuitry (not shown) that includes sensing, driver and comparator circuitry and column sample and hold (S/H) circuitry.

Each pixel circuit $910_1, \ldots, 910_n$ includes a pinned photodiode photosensor 912, read transfer gate 914, storage transfer gate 915, and a floating diffusion region FD to collect charge transferred from the photosensor 912, a reset transistor 916, row select transistor 920, source follower output transistor 918, storage gate 924 and two anti-blooming gates 925, 929 used to drain away charge to region 927 when the gates 925, 927 are activated. The first anti-blooming gate 925 is controlled by a first AB control signal AB_X and the second anti-blooming gate 929 is controlled by a second AB control signal AB_Y. It should be noted that FIG. 12 illustrates numerous first AB control signals AB_X1, AB_X2, AB_X3, AB_X4, AB_$_x$X5, . . . AB_Xn, one for each column $COL_1$, $COL_2$, $COL_3$, $COL_4$, $COL_5$, . . . $COL_n$, but that the detailed view of pixel $910_1$, uses the generic label AB_X. Likewise, FIG. 12 illustrates numerous voltage memories Vmem1, Vmem2, . . . , Vmemn, and pixel outputs Pix_out1, Pix_out2, while the detailed view of pixel $910_1$ uses the generic labels Vmem and Vout.

As can be seen, a comparator 954 and three transistors 940, 942, 944 are shared by columns $COL_1$, $COL_2$, $COL_3$, $COL_4$, $COL_5$, . . . $COL_n$. The comparator 954 comprises five p-channel transistors 960, 964, 966, 970, 972 and four n-channel transistors 962, 963, 968, 974. The A input is connected to a reference voltage Vreference. The B input is connected to the SG line 924a. An output node labeled A_gt_B, is used as the output of the comparator 954. Transistor 963 is used as a bias transistor and is controlled by an IBIAS control signal.

The comparator 954 output drives anti-blooming gate 929 (via AB control signal AB_Y) to reset the photosensor 912 if the signal detected is large enough. The storage gates 924 are controlled for each row $ROW_0$, $ROW_1$, etc. The storage transfer gate control signals TX_store (e.g., TX_store1, TX_store2) are routed for each column $COL_1$, $COL_2$, $COL_3$, $COL_4$, $COL_5$, . . . $COL_n$ to control which column $COL_1$, $COL_2$, $COL_3$, $COL_4$, $COL_5$, . . . $COL_n$ has pixels 910 being checked. When the strobe signal is low or when the reference Vreference to the comparator 954 is lower than the input from the storage gate 924, the comparator 954 output is low. If enough charge is transferred under the storage gate 924, the comparator 954 output will go high. This high level resets the photosensor 912 through anti-blooming gate 929 (via AB control signal AB_Y).

The array 902 is subsequently scanned row by row and each comparator 954 output is checked by the column circuit through the source follower transistor 942. When the comparator 954 output is high it dominates driving the pixel output Vout. The column circuit comparator checks the output of the local pixel comparator circuit to see if it is at a high level. This value is latched in the column and the strobe signal STROBE is set low for that row to turn off the comparator 954. Then the floating diffusion region FD is read for that row of pixels in order to update the value based on the comparison result. To further clarify the conditioning step used to measure the pixel charge prior to the compare operation, the following operation occurs: SG_Vbias can be set to either a low voltage (e.g., 0V to turn SG off) or high voltage (e.g., 2.8V to precharge SG) on line 950 and drives the SG line 924a when Drive_SG is set high on line 952. Before the compare operation, SG line 924a is precharged high (SG_Vbias and Drive_SG set high) before the TX_store control signal is activated (after Drive_SG is set low again). When the signal STROBE is activated and if the B input (connected to the SG line 924a) drops below the Vreference (set to e.g., 200 mV below the SG line precharge level), the comparator 954 output goes high.

Column circuits activate TX_store1 to perform the sense/compare operation on column one $COL_1$. To perform comparison on other columns $COL_2$, $COL_3$, $COL_4$, $COL_5$, ... $COL_n$, the corresponding TX_store control signal (e.g., TX_store2, etc.) is activated.

In the FIG. 12 embodiment, there are twelve extra transistors shared between N pixels (in the same row) including nine from the comparator 954. When N is twelve, one extra transistor per pixel is added to perform the comparison. It should be noted that multiple scans of the array are performed during each frame. In rolling shutter operation, if the design is set to measure the pixel level four times during a frame (to increase the range by 4 times), then enough time during the row time must be allowed for the sample operation. For global shutter operation, the integration time and readout time cannot overlap with this approach because the storage gate contains the currently frame data being readout. Hence, the storage gate cannot be used to sense charge.

Figure 13:
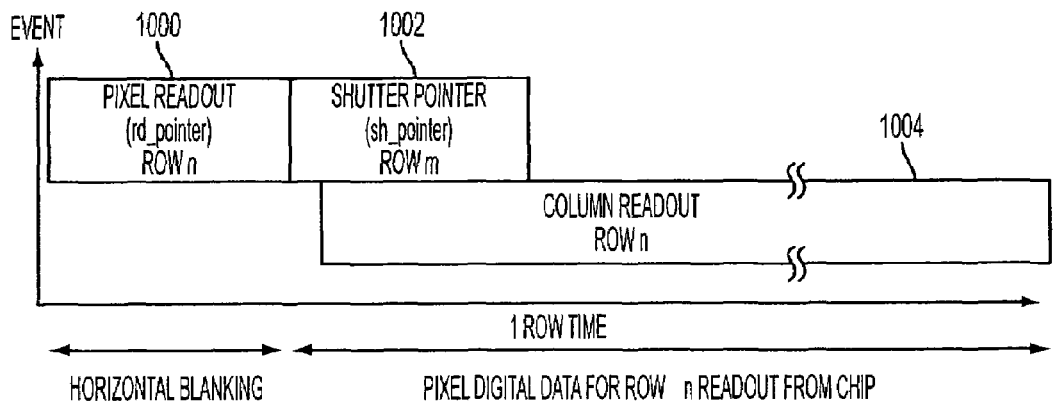
FIG. 13 is a timing diagram of an operation of a conventional imager.

FIG. 13 is a timing diagram of an operation of a conventional imager, such as the imager 100 illustrated in FIG. 1. The diagram illustrates a horizontal blanking period and a readout period for ROW n. Typically, exposure time is defined in terms of the number of row times between initializing a pixel for integration (i.e., resetting the pixel) and reading the pixel value into the column circuits. The digital control logic of the imager keeps track of the row address of the pixels to be readout with a digital read pointer (rd_pointer). The same control logic keeps track of the row address of the pixels to be initialized with a shutter pointer (sh_pointer). In the conventional imager operation, a row (ROW n) of pixels is first read into the column sample and hold circuitry at the end of an integration period (block 1000). After that time, the shutter pointer sets the starting point for pixel integration for all pixels in another row (ROW m) (block 1002) while a column readout of the pixels from the row read into the column sample and hold circuitry (i.e., ROW n, using the read pointer rd_pointer) begins (block 1004).

Figure 14:
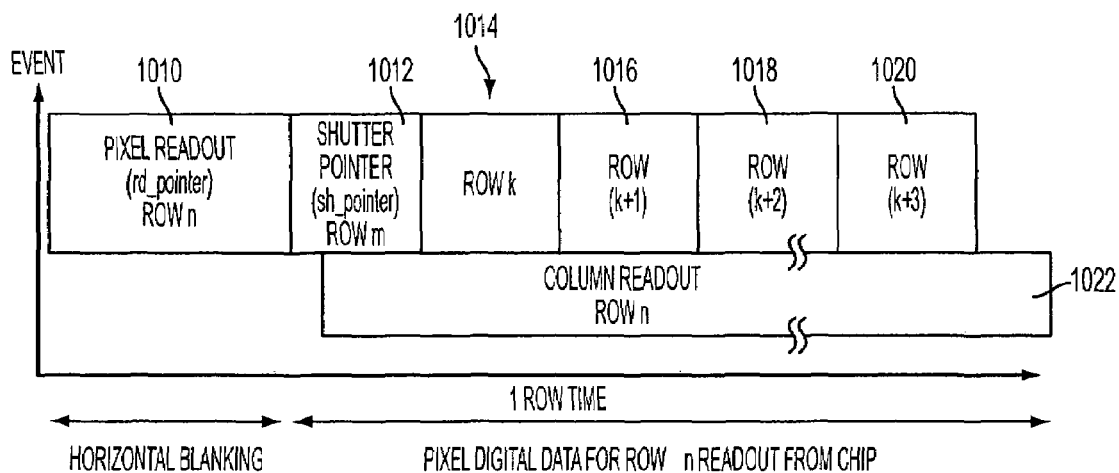
FIG. 14 is a timing diagram of an operation of the FIG. 2 imager according to an embodiment of the invention.

FIG. 14 is a timing diagram of an operation of the FIG. 2 imager 200. Similar to the conventional operation illustrated in FIG. 13, a row (ROW n) of pixels is read into the column sample and hold circuits using the read pointer rd_pointer (block 1010). After that time, the shutter pointer sets the starting point for pixel integration for all pixels in another row (ROW m) (block 1012) while a column readout of the pixels from the row read into the column sample and hold circuitry (i.e., ROW n, using the read pointer rd_pointer) begins (block 1022). Unlike the conventional operation, a sense operation for another row (ROW k) in the array is performed and the flag stored in the floating diffusion region is updated (block 1014). Charge sensing occurs in additional rows (i.e., rows k+1, k+2, k+3) in subsequent periods (blocks 1016, 1018, 1020) whereby the flag stored in the floating diffusion region is updated for each of these rows.

Figure 15:
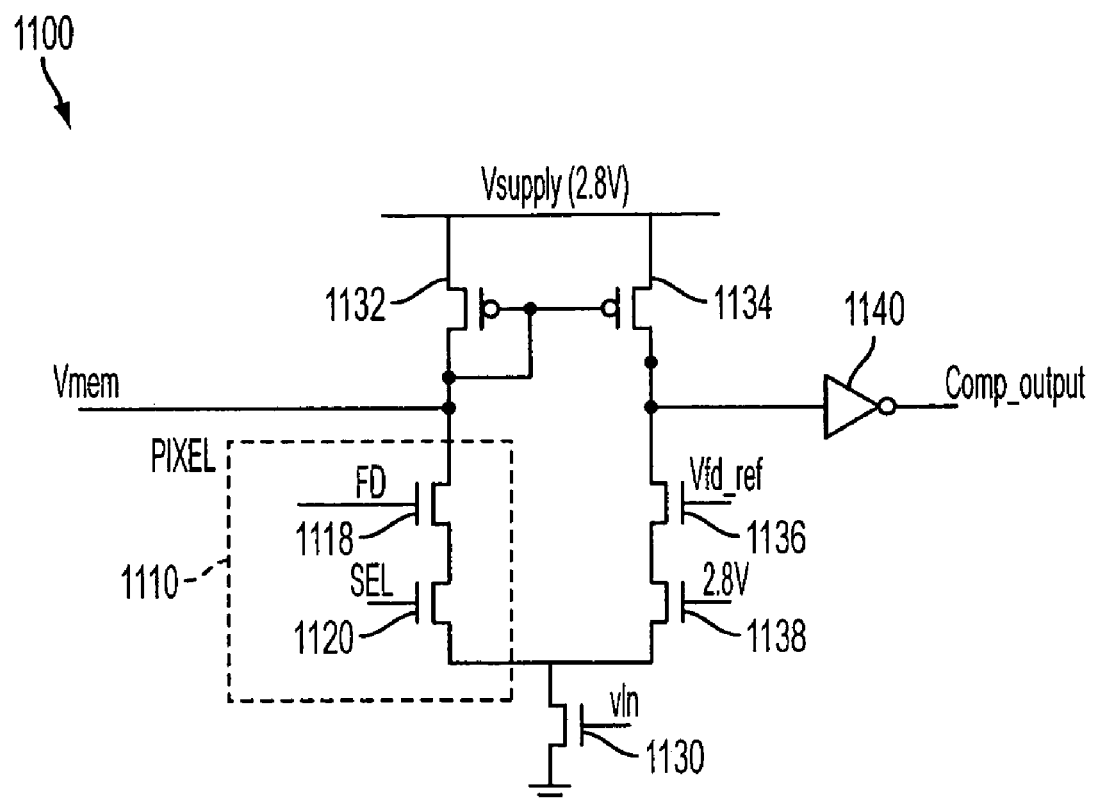
FIG. 15 illustrates a continuous time comparator circuit constructed in accordance with an embodiment of the invention.

FIG. 15 illustrates a continuous time comparator circuit 1100 constructed in accordance with an embodiment of the invention. The comparator circuit 1100 can be used to determine the floating diffusion voltage flag level and incorporates a pixel circuit 1110 (only a portion of the pixel 1110 is shown). The effective use of shared circuitry in the illustrated embodiment can also be applied to column circuit to minimize the column circuitry area. The comparator circuit 1100 includes two PMOS transistors 1132, 1134, an inverter 1140, three NMOS transistors 1130, 1136, 1138, and the pixel circuit 1110. The pixel circuit 1110 includes a source follower transistor 1118 having its gate connected to a floating diffusion region FD, a row select transistor 1120 connected to a row select control signal SEL, and other components (not shown). Transistor 1130 serves as a biasing transistor and is activated by a biasing control signal Vln.

It should be noted that the "skim" operation is not exact because thermal energy of the electrons in the photosensor (e.g., pinned photodiode) allows a statistically varying amount of charge that have enough energy pass over the storage transfer gate barrier to the storage gate channel. However, if the amount of charge required to reach the barrier is large enough, the shot noise associated with the input signal that generated that charge will exceed this noise. For example, if the noise in the thresholding process is 10 electrons, but 2500 electrons are required to reach the level, the shot noise of 50 electrons dominates the noise in the operation. Accordingly, the n-channel transistor 1136 is larger than other comparator input to build in an offset to make the comparator flip if Vfd_ref equals the voltage on the floating diffusion region FD within some tolerance such as e.g., 100 mV.

Figure 16:
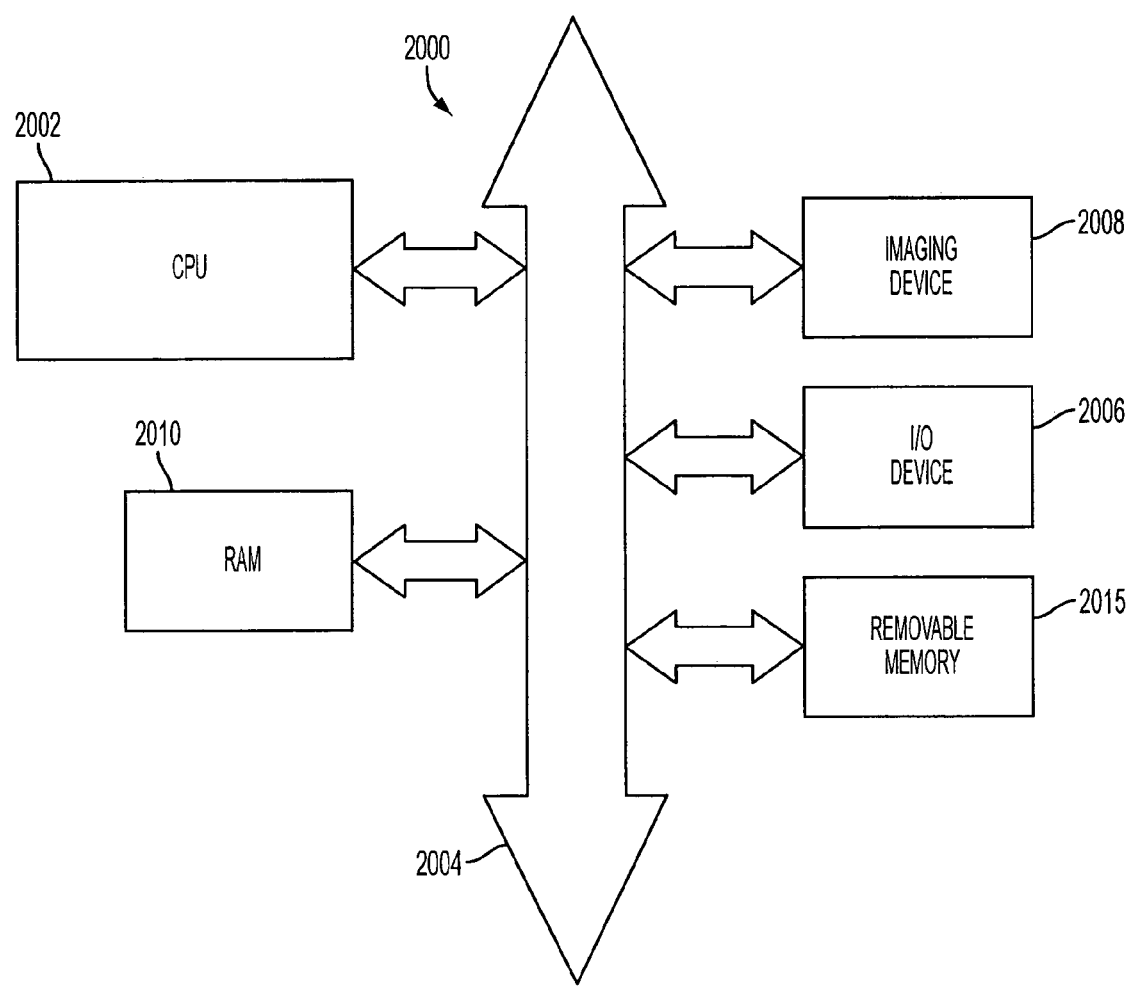
FIG. 16 illustrates a system suitable for use with any one of the embodiments of the invention.

FIG. 16 illustrates a system 2000, a typical processor system modified to include an imaging device 2008 constructed in accordance with one of the embodiments discussed herein. The system 2000 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 2000, for example a camera system, generally comprises a central processing unit (CPU) 2002, such as a microprocessor, that communicates with an input/output (I/O) device 2006 over a bus 2004. Imaging device 2008 also communicates with the CPU 2002 over the bus 2004. The system 2000 also includes random access memory (RAM) 2010, and can include removable memory 2015, such as flash memory, which also communicate with the CPU 2002 over the bus 2004. The imaging device 2008 may be combined with a processor, such as a CPU, digital signal processor, or microprocessor, with or without memory storage on a single integrated circuit or on a different chip than the processor. The imaging device 2008 may be any one of the imagers 200, 900 constructed as discussed herein.

It should be appreciated that the above noted operations do not require high precision matching or accuracy and thus, it is expected that the additional column circuits will not require as much space or power as other typical high precision column parallel circuits. High accuracy is not required because enough margin is built into the charge skim/thresholding operation so that if the comparator makes the incorrect decision, charge can still continue to build up in the pixel until the next comparison. By the next comparison step there will be enough charge to definitively make the comparator sense the excess charge. During the primary pixel readout step, the fixed charge level is sampled to track pixel to pixel variation in pinned potential (e.g., if a pinned photodiode is used as the photosensor) and transfer gate threshold variations that determine the charge level removed.

This additional sample step requires an additional set of sample and hold capacitors in the column and extra time to perform the analog-to-digital conversion of this data. The step of adding the signal representing the fixed charge removed during the integration time to the final pixel value can also be done in the analog domain during column readout using switched capacitor techniques.

The processes and devices described above illustrate preferred methods and typical devices of many that could be used and produced. The above description and drawings illustrate embodiments, which achieve the objects, features, and advantages described herein. However, it is not intended that the embodiments be strictly limited to the above-described and illustrated embodiments.

What is claimed as new and desired to be protected by Letters Patent of the United States is:

1. An imaging device comprising:
a plurality of pixels, each pixel comprising a photo sensor, a first gate for storing charge from the photosensor when activated by a first control signal during a sampling period, and a floating diffusion region for storing charge transferred from the photosensor after an integration period;
a plurality of sense circuits, each sense circuit being connected to and associated with a column of pixels, each sense circuit generating the first control signal during the sampling period for a selected pixel in its respective column and sensing whether an amount of charge stored under the first gate of the selected pixel exceeds a predetermined threshold, each sense circuit outputting to the pixel a voltage flag representative of a number of times the sensed charge exceeds the predetermined threshold within the integration period,
wherein each pixel stores the voltage flag in its floating diffusion region during the sampling period to indicate a number of times the sensed charge exceeds the predetermined threshold during the integration period; and
an image processor adapted to modify pixel signals output after the integration period based on the number of times the sensed charge exceeded the predetermined threshold in the integration period,
wherein at least one of said sense circuits comprises:
a sensing portion for sensing the charge stored under the first gate and outputting the sensed charge as a first output;
a first comparator portion for comparing the first output to the predetermined threshold, the first comparator portion generating a second output each time the first output exceeds the predetermined threshold;
an adder connected to the first comparator portion and summing a number of second outputs from the first comparator portion; and
a flag setting portion for setting a value of the voltage flag based on the summed number of second outputs.

2. The imaging device of claim 1, wherein each pixel further comprises:
a second gate for transferring charge from the photosensor to the first gate when activated by a second control signal, and
a third gate connected to receive the voltage flag and output the voltage flag to the floating diffusion region in response to a third control signal.

3. The imaging device of claim 2, further comprising a fourth gate for transferring charge received from the photosensor through the first gate to the floating diffusion region.

4. The imaging device of claim 2, wherein the first gate is a storage gate transistor, the second gate is a first transfer gate, the third gate is a reset transistor and the fourth gate is a second transfer gate.

5. The imaging device of claim 1, wherein the sense circuit precharges a line connected to the first gate of each selected pixel in its column before performing the sampling operation.

6. The imaging device of claim 1, wherein charged transferred under the first gate is pushed back to the photosensor after the sampling period.

7. The imaging device of claim 1, wherein each sense circuit senses the charge under the selected pixel more than one time during the integration period.

8. The imaging device of claim 1, wherein the pixels share a sensing line with other pixels in a same column and the device further comprises a circuit for buffering the sensing line.

9. The imaging device of claim 1, wherein the device is operated by a controller using a rolling shutter.

10. The imaging device of claim 1, wherein the device is operated by a controller using a global shutter.

11. The imaging device of claim 1, wherein pixel signals output after the integration period are also based on an amount of fixed charge drained from the photosensor during the integration period.

12. An imaging device comprising:
a plurality of pixels, each pixel comprising a photosensor, a first gate for storing charge from the photosensor when activated by a first control signal during a sampling period, a second gate for transferring charge from the photosensor to the first gate when activated by a second control signal, a first anti-blooming gate, a floating diffusion region for storing charge transferred from the photosensor after an integration period, and a third gate connected to receive a voltage flag and output the voltage flag to the floating diffusion region in response to a third control signal;
a plurality of sense circuits, each sense circuit being connected to and associated with a column of pixels, each sense circuit generating the first control signal during the sampling period for a selected pixel in its respective column and sensing whether an amount of charge stored under the first gate of the selected pixel exceeds a predetermined threshold, each sense circuit comprising a circuit counting a number of times the sensed charge exceeds the predetermined threshold, each sense circuit outputting to the pixel a voltage flag representative of the number of times the sensed charge exceeds the predetermined threshold within the integration period,
wherein each pixel stores the voltage flag in its floating diffusion region during the sampling period to indicate the number of times the sensed charge exceeds the predetermined threshold during the integration period, and the first anti-blooming gate drains charge away from the photosensor when the sense circuit determines that the amount of charge stored under the first gate exceeds the predetermined threshold; and an image processor adapted to modify pixel signals output after the integration period based on the number of times the sensed charge exceeded the predetermined threshold in the integration period.

13. The imaging device of claim 12, wherein each pixel comprises a second anti-blooming gate, wherein the first anti-blooming gate is activated for a selected row and the second anti-blooming gate is activated for a selected column to reset the pixel photosensor independent of other pixels in its column or row.

14. A camera system comprising:
a processor; and
an imaging device communicating with the processor, the device comprising:
a plurality of pixels, each pixel comprising a photosensor, a first gate for storing charge from the photosensor when activated by a first control signal during a sampling period, and a floating diffusion region for storing charge transferred from the photosensor after an integration period, and
a plurality of sense circuits, each sense circuit being connected to and associated with a column of pixels, each sense circuit generating the first control signal during the sampling period for a selected pixel in its respective column and sensing whether an amount of charge stored under the first gate of the selected pixel exceeds a predetermined threshold, each sense circuit outputting to the pixel a voltage flag representative of a number of times the sensed charge exceeds the predetermined threshold within the integration period,
wherein each pixel stores the voltage flag in its floating diffusion region during the sampling period to indicate a number of times the sensed charge exceeds the predetermined threshold during the integration period; and
an image processor adapted to modify pixel signals output after the integration period based on the number of times the sensed charge exceeded the predetermined threshold in the integration period,
wherein at least one of said sense circuits comprises:
a sensing portion for sensing the charge stored under the first gate and outputting the sensed charge as a first output;
a first comparator portion for comparing the first output to the predetermined threshold, the first comparator portion generating a second output each time the first output exceeds the predetermined threshold;
an adder connected to the first comparator portion and summing a number of second outputs from the first comparator portion; and
a flag setting portion for setting a value of the voltage flag based on the summed number of second outputs.

15. The camera system of claim 14, wherein each pixel further comprises:
a second gate for transferring charge from the photosensor to the first gate when activated by a second control signal, and
a third gate connected to receive the voltage flag and output the voltage flag to the floating diffusion region in response to a third control signal.

16. The camera system of claim 15, further comprising a fourth gate for transferring charge received from the photosensor through the first gate to the floating diffusion region.

17. The camera system of claim 15, wherein the first gate is a storage gate transistor, the second gate is a first transfer gate, the third gate is a reset transistor and the fourth gate is a second transfer gate.

18. The camera system of claim 14, wherein each pixel further comprises at least one anti-blooming gate to drain charge away from the photosensor after the sense circuit determines that the amount of charge stored under the first gate exceeds the predetermined threshold.

19. The camera system of claim 18, wherein each pixel comprises two anti-blooming gates, wherein a first of the anti-blooming gates is activated for a selected row and a second of the anti-blooming gates is activated for a selected column to reset the pixel photosensor independent of other pixels in its column or row.

20. The camera system of claim 14, wherein the sense circuit precharges a line connected to the first gate of each selected pixel in its column before performing the sampling operation.

21. The camera system of claim 14, wherein charged transferred under the first gate is pushed back to the photosensor after the sampling period.

22. The camera system of claim 14, wherein each sense circuit senses the charge under the selected pixel more than one time during the integration period.

23. The camera system of claim 14, wherein the pixels share a sensing line with other pixels in a same column and the device further comprises a circuit for buffering the sensing line.

24. The camera system of claim 14, wherein the imaging device further comprises a controller that operates the imaging device using a rolling shutter.

25. The camera system of claim 14, wherein the imaging device further comprises a controller operating the imaging device using a global shutter.

26. The camera system of claim 14, wherein pixel signals output after the integration period are also modified based on an amount of fixed charge drained from the photosensor during the integration period.

* * * * *